(12) United States Patent
Song et al.

(10) Patent No.: US 11,901,493 B2
(45) Date of Patent: Feb. 13, 2024

(54) SEMICONDUCTOR DEVICES INCORPORATING QUANTUM DOTS

(71) Applicant: Saphlux, Inc., Branford, CT (US)

(72) Inventors: Jie Song, Branford, CT (US); Chen Chen, Branford, CT (US)

(73) Assignee: Saphlux, Inc., Branford, CT (US)

( * ) Notice: Subject to any disclaimer, the term of this patent is extended or adjusted under 35 U.S.C. 154(b) by 0 days.

(21) Appl. No.: 18/365,758

(22) Filed: Aug. 4, 2023

(65) Prior Publication Data

US 2023/0378400 A1 Nov. 23, 2023

Related U.S. Application Data

(60) Division of application No. 17/714,814, filed on Apr. 6, 2022, now Pat. No. 11,757,072, which is a continuation-in-part of application No. PCT/US2021/014402, filed on Jan. 21, 2021, and a continuation-in-part of application No. 16/816,136, filed on Mar. 11, 2020.

(60) Provisional application No. 63/002,757, filed on Mar. 31, 2020, provisional application No. 62/968,579, filed on Jan. 31, 2020, provisional application No.
(Continued)

(51) Int. Cl.
*H01L 33/50* (2010.01)
*H01L 25/075* (2006.01)
*H01L 33/46* (2010.01)

(52) U.S. Cl.
CPC ........ *H01L 33/504* (2013.01); *H01L 25/0753* (2013.01); *H01L 33/46* (2013.01); *H01L 2933/0025* (2013.01); *H01L 2933/0041* (2013.01); *H01L 2933/0091* (2013.01)

(58) Field of Classification Search
None
See application file for complete search history.

(56) References Cited

U.S. PATENT DOCUMENTS 8,941,293 B2  1/2015  Cheon et al.
10,459,284 B1 10/2019  Kuo et al.
(Continued)

FOREIGN PATENT DOCUMENTS

CN  113540324 B  9/2022

OTHER PUBLICATIONS

International Searching Authority (ISA)/US, International Search Report and Written Opinion for PCT/US2021/014402, dated Apr. 8, 2021, 7 pages.
(Continued)

*Primary Examiner* — Sarah K Salerno
(74) *Attorney, Agent, or Firm* — Jaffery Watson Mendonsa & Hamilton LLP

(57) ABSTRACT

In accordance with one or more aspects of the present disclosure, a semiconductor device is provided. The semiconductor device may include: a plurality of light-emitting devices comprising a first light-emitting device, a second light-emitting device, and a third light-emitting device; and a light-conversion device with embedded quantum dots. In some embodiments, a first portion of the light-conversion device includes a first plurality of quantum dots for converting light produced by the first light-emitting device into light of a first color, and a second portion of the light-conversion device includes a second plurality of quantum dots for converting light produced by the second light-emitting device into light of a second color. The third light-emitting device emits light of a third color.

18 Claims, 29 Drawing Sheets

Related U.S. Application Data

62/964,101, filed on Jan. 21, 2020, provisional application No. 62/816,595, filed on Mar. 11, 2019.

(56) References Cited

U.S. PATENT DOCUMENTS

| | | |
|---|---|---|
| 10,622,498 B2 | 4/2020 | Wang et al. |
| 11,757,072 B2 | 9/2023 | Song et al. |
| 2013/0240348 A1 | 9/2013 | Mi et al. |
| 2014/0340912 A1 | 11/2014 | Kang et al. |
| 2015/0053916 A1 | 2/2015 | Pickett et al. |
| 2017/0158959 A1 | 6/2017 | Pickett et al. |
| 2017/0170152 A1 | 6/2017 | Wi et al. |
| 2018/0011231 A1 | 1/2018 | Jiang et al. |
| 2018/0350871 A1 | 12/2018 | Lee et al. |
| 2019/0086733 A1 | 3/2019 | Min et al. |
| 2020/0048545 A1 | 2/2020 | Kalisman |
| 2020/0051959 A1 | 2/2020 | Pschenitzka |
| 2020/0152694 A1 | 5/2020 | Lee et al. |
| 2020/0152841 A1 | 5/2020 | Han et al. |
| 2020/0168771 A1 | 5/2020 | Anc et al. |
| 2020/0287102 A1 | 9/2020 | Bertram et al. |
| 2020/0295239 A1 | 9/2020 | Song et al. |
| 2022/0231203 A1 | 7/2022 | Song et al. |

OTHER PUBLICATIONS

Tongtong Xuan et al. "Super-Hydrophobic Cesium Lead Halide Perovskite Quantum Dot-Polymer Composites with High Stability and Luminescent Efficiency for Wide Color Gamut White Light-Emitting Diodes," Chemistry of Materials, Jan. 17, 2019, 10 pages, published by the American Chemical Society, Washington DC.

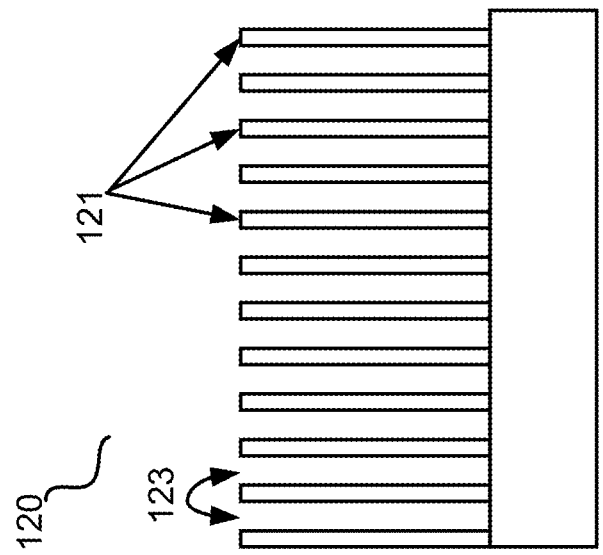
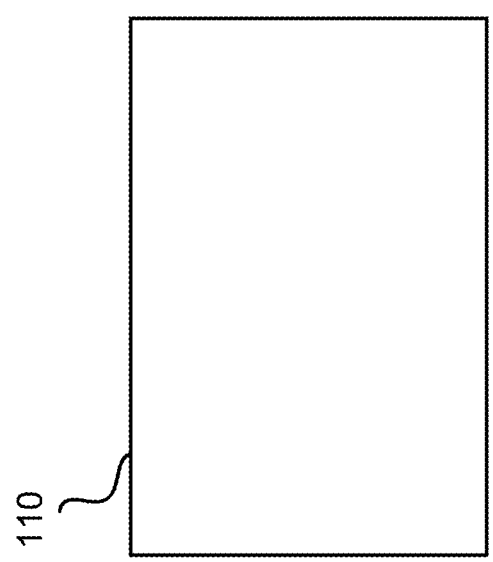

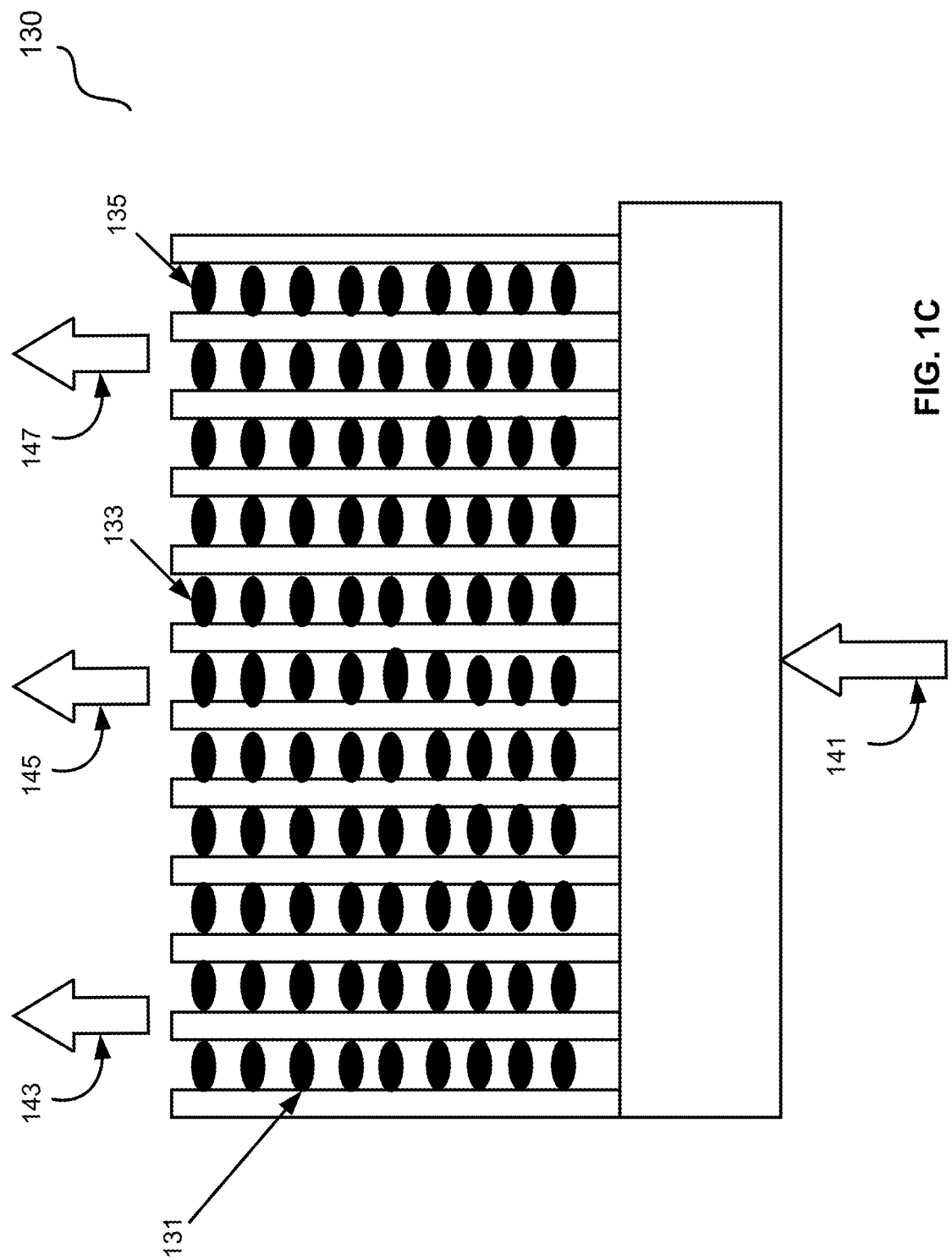

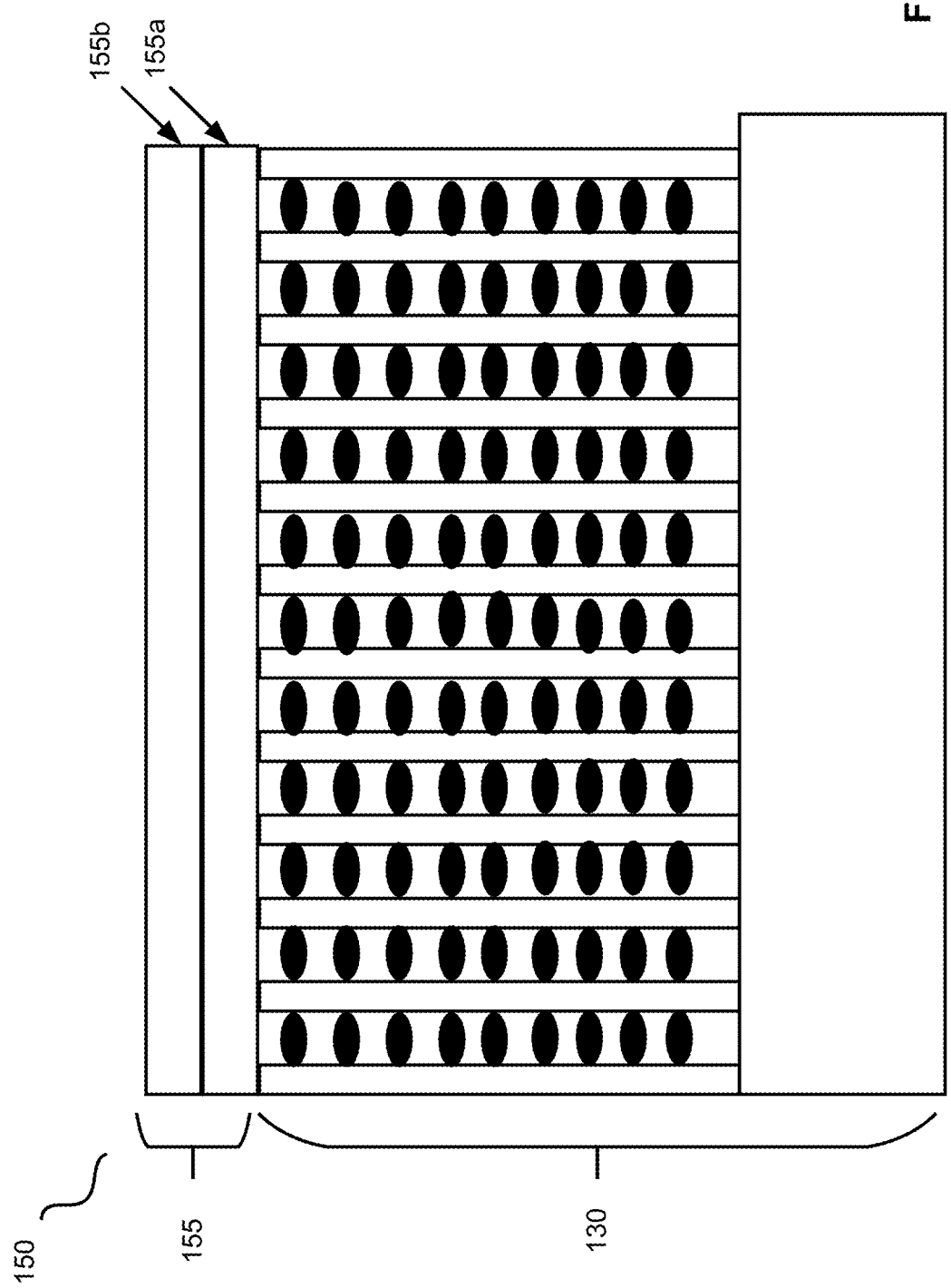

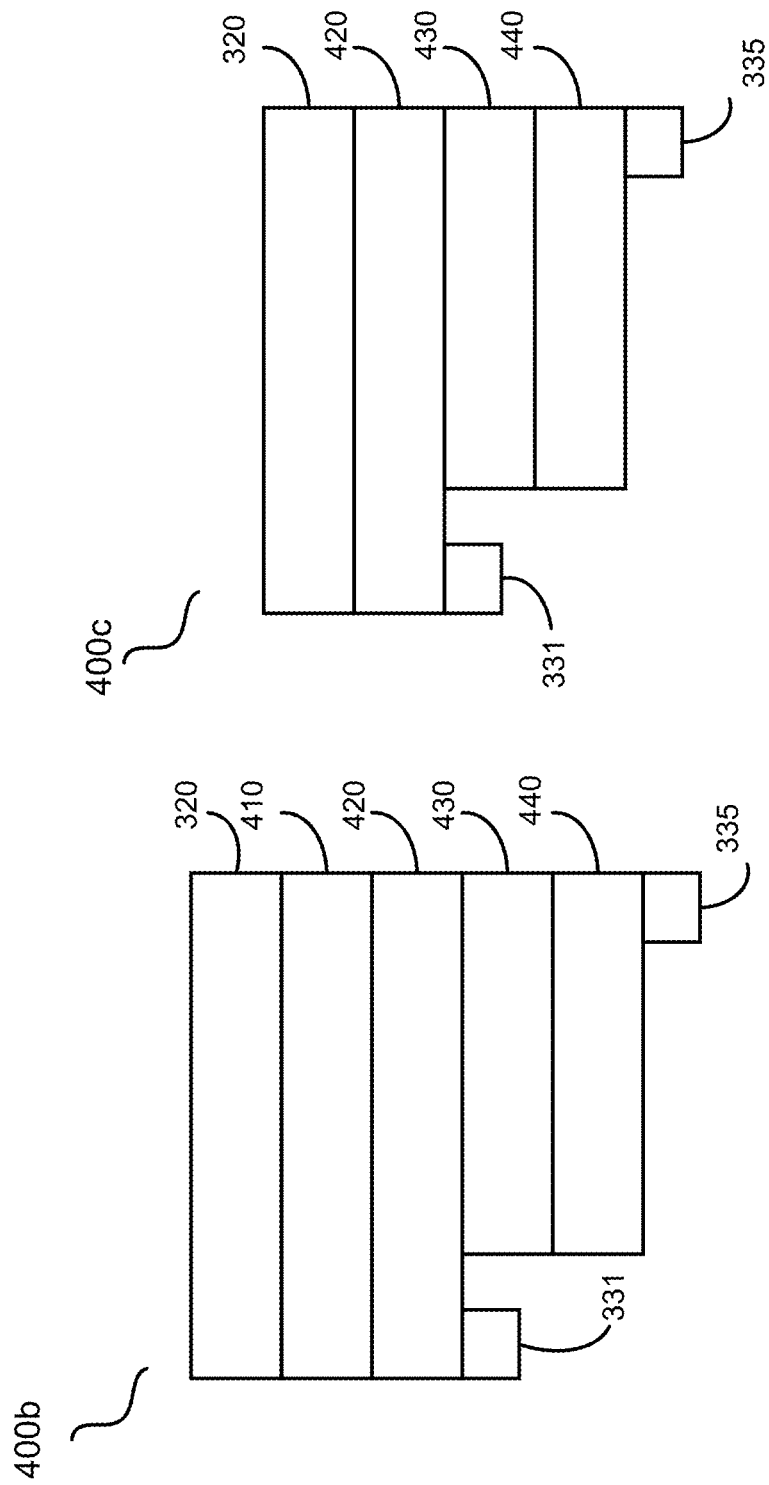

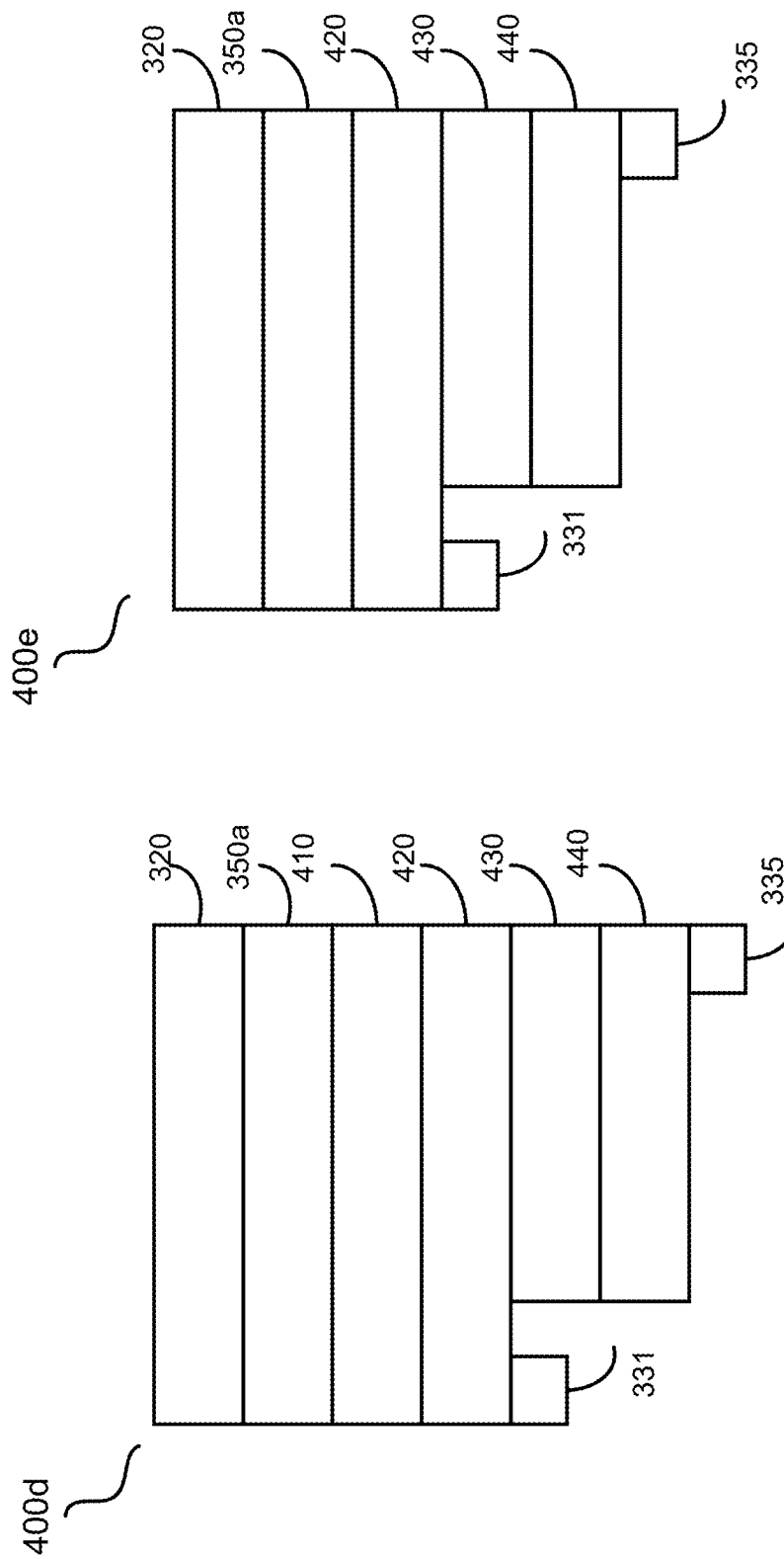

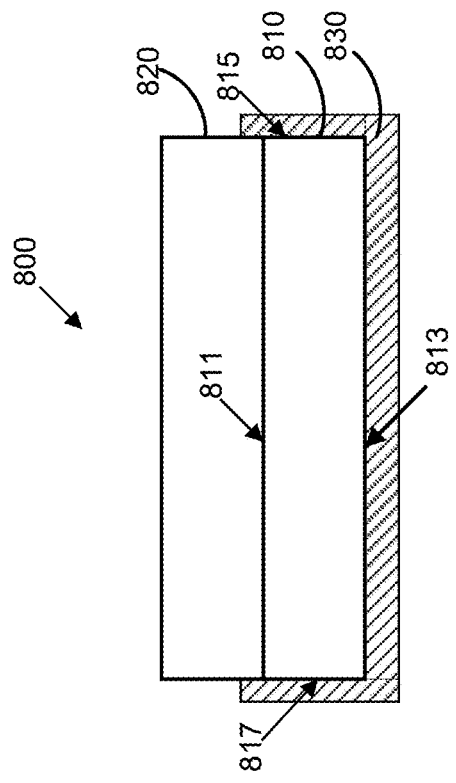
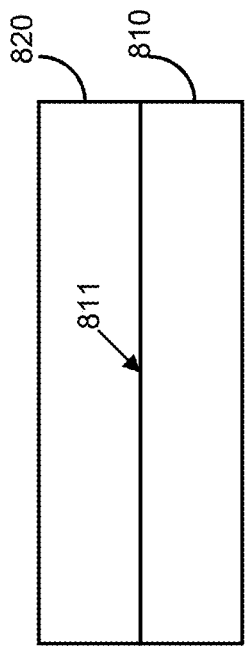
FIG. 8

SEMICONDUCTOR DEVICES INCORPORATING QUANTUM DOTS

CROSS-REFERENCE TO RELATED APPLICATIONS

This application is a divisional application of U.S. patent application Ser. No. 17/714,814, entitled "Semiconductor Devices Incorporating Quantum Dots," filed Apr. 6, 2022, which is a continuation-in-part of PCT/US21/14402, filed Jan. 21, 2021, and a continuation-in-part of U.S. patent application Ser. No. 16/816,136, entitled "Light Conversion Devices Incorporating Quantum Dots," filed Mar. 11, 2020, each of which is incorporated herein in its entirety. PCT/US21/14402 claims the benefits of U.S. Patent Application No. 62/964,101, entitled "Light-Emitting Devices Incorporating Quantum Dots," filed Jan. 21, 2020, U.S. Patent Application No. 62/968,579, entitled "Light-Conversion Devices Incorporating Quantum Dots," filed Jan. 31, 2020, U.S. Patent Application No. 63/002,757, entitled "Protection Layers for Light-Conversion Devices Incorporating Quantum Dots," filed Mar. 31, 2020, each of which is incorporated herein in its entirety. U.S. patent application Ser. No. 16/816,136 claims the benefits of U.S. Patent Application No. 62/816,595, filed Mar. 11, 2019, and U.S. Patent Application No. 62/964,101, filed Jan. 21, 2020, each of which is incorporated herein in its entirety.

TECHNICAL FIELD

The implementations of the disclosure relate generally to semiconductor devices and, more specifically, to semiconductor devices incorporating quantum dots (QDs) and methods of fabricating the same.

BACKGROUND

Quantum dots (QDs) are semiconductor particles in nanoscale sizes. When a QD is illuminated by light, an electron in the QD may be excited to a state of higher energy. The QD may thus emit light of a certain wavelength. QDs of various shapes, sizes, compositions, etc. may emit light with various wavelengths. For example, a relatively larger QD may emit light with a relatively longer wavelength, while a relatively smaller QD may emit light with a relatively shorter wavelength.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In accordance with one or more aspects of the present disclosure, a semiconductor device is provided. The semiconductor device includes: a light-emitting structure comprising a first light-emitting device, a second light-emitting device, and a third light-emitting device, wherein each of the first light-emitting device, the second light-emitting device, and the third light-emitting device comprises a first ohmic contact and a second ohmic contact; and a light-conversion device comprising one or more porous structures with embedded quantum dots, wherein a first portion of the light-conversion device comprises a first plurality of quantum dots for converting light produced by the first light-emitting device into light of a first color, wherein a second portion of the light-conversion device comprises a second plurality of quantum dots for converting light produced by the second light-emitting device into light of a second color, and wherein the third light-emitting device emits light of a third color. In some embodiments, the first ohmic contact and the second ohmic contact are deposited on a first side of the light-emitting structure. The light-conversion device is formed on a second side of the light-emitting structure that is opposite to the first side of the light-emitting structure.

In some embodiments, the first plurality of quantum dots is placed in a first plurality of pores in the first portion of the light-conversion device, and wherein the second plurality of quantum dots is placed in a second portion of the light-conversion device.

In some embodiments, a diameter of at least one of the first plurality of pores is not greater than 500 nm, and wherein a depth of the at least one of the first plurality of pores is not less than 1 µm. In some embodiments, the diameter of at least one of the first plurality of pores is not less than 1 nm.

In some embodiments, the semiconductor device further includes a protection structure covering surfaces of one or more of the quantum dots embedded in the plurality of nanoporous structures.

In some embodiments, the semiconductor device further includes the protection structure is positioned between the light-emitting structure and the plurality of nanoporous structures.

In some embodiments, the first portion of the light-conversion device and the second portion of the light-conversion device are separated by a trench, and wherein at least one sidewall of the trench is coated with a metallic material.

In some embodiments, the semiconductor device further includes scattering media configured to cause scattering of at least a portion of light produced by the light-emitting structure.

In some embodiments, a sidewall of the semiconductor device is coated with a reflective material.

In some embodiments, the one or more porous structures are not in direct contact with the plurality of light-emitting devices.

In some embodiments, the first color is red, wherein the second color is green, and wherein the third color is blue.

In some embodiments, a dimension of the first portion of the light-conversion device is not greater than (e.g., about or less than) 100 µm.

In some embodiments, a dimension of the first portion of the light-conversion device is not greater than (e.g., about or less than) 50 µm.

In accordance with one or more aspects of the present disclosure, a method for fabricating the semiconductor device is provided. The method includes: providing a light-emitting structure comprising a first light-emitting device, a second light-emitting device, and a third light-emitting device, wherein each of the first light-emitting device, the second light-emitting device, and the third light-emitting device comprises a first ohmic contact and a second ohmic contact; and providing a light-conversion device comprising one or more porous structures with embedded quantum dots, wherein a first portion of the light-conversion device comprises a first plurality of quantum dots for converting light produced by the first light-emitting device into light of a first color, wherein a second portion of the light-conversion device comprises a second plurality of quantum dots for converting light produced by the second light-emitting device into light of a second color, and wherein the third light-emitting device emits light of a third color.

In some embodiments, providing the light-conversion device includes placing the first plurality of quantum dots in the first portion of the light-conversion device; and placing the second plurality of quantum dots in the second portion of the light-conversion device.

In some embodiments, the first plurality of quantum dots in the first portion of the light-conversion device is placed using at least one of a photolithography method or an inkjet printing method.

In some embodiments, placing the first plurality of quantum dots in the first portion of the light-conversion device includes dispensing, by a dispensing machine, a first liquid including the first plurality of quantum dots on a surface of the porous structure. In some embodiments, placing the second plurality of quantum dots in the second portion of the light-conversion device includes dispensing, using the dispensing machine, a second liquid including the second plurality of quantum dots on the surface of the porous structure.

In some embodiments, the first liquid containing the first plurality of quantum dots is dispensed on a surface of a first nanoporous structure. The second liquid containing the second plurality of quantum dots is dispensed on a surface of a second nanoporous structure. The first nanoporous structure includes a first plurality of nanopores. The second nanoporous structure includes a second plurality of nanopores different from the first plurality of nanopores.

In some embodiments, the first liquid and the second liquid are dispensed on the surface of the porous structure via a first channel and a second channel of the dispensing machine, respectively. In some embodiments, each of the plurality of channels of the dispensing machine includes one or more dispensing nozzles.

In some embodiments, the first liquid and the second liquid are dispensed on the porous structure sequentially. In some embodiments, the first liquid and the second liquid are dispensed on the porous structure at the same time.

In some embodiments, the method further includes forming a protection structure covering surfaces of one or more of the quantum dots embedded in the one or more porous structures.

In some embodiments, providing the light-conversion device comprising the one or more porous structures with the embedded quantum dots includes: forming a plurality of nanoporous structures separated by a plurality of trenches; and coating at least one sidewall of at least one of the trenches with a metallic material.

In some embodiments, the method further includes attaching the light-emitting structure to the light-conversion device. Attaching the light-emitting structure to the light-conversion device includes bonding the light-conversion device to the second side of the light-emitting structure.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIGS. 1A, 1B, 1C, and 1D are block diagrams illustrating structures associated with an example process for fabricating a light conversion device in accordance with some embodiments of the present disclosure.

FIGS. 4B, 4C, 4D, 4E, 4F, and 4G are schematic diagrams illustrating examples of semiconductor devices including a flip-chip light-emitting structure in accordance with some embodiments of the present disclosure.

FIG. 8 depicts example structures and processes of fabricating a light-conversion device in accordance with some embodiments of the present disclosure.

DETAILED DESCRIPTION

Figure 2B:
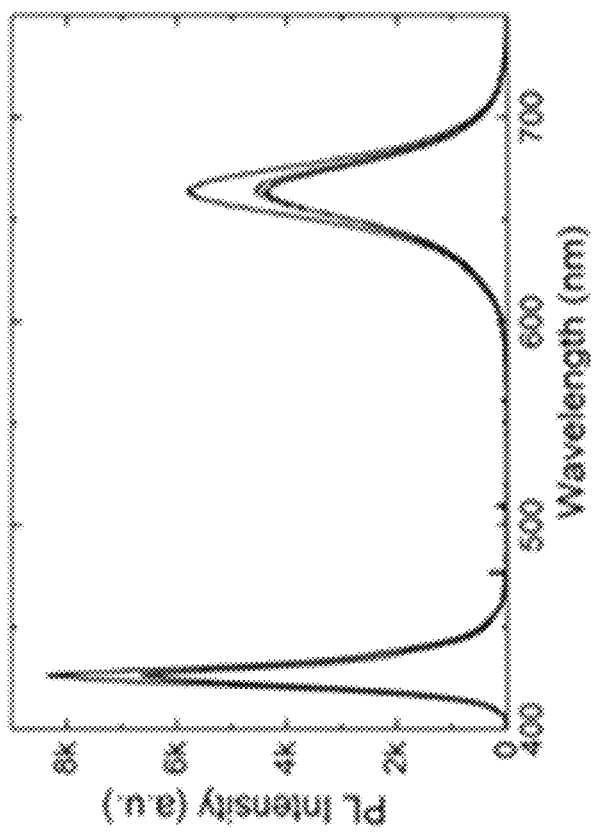
FIG. 2B depicts a photoluminescence (PL) spectrum of an example light conversion device in accordance with one or more aspects of the present disclosure.

Aspects of the disclosure provide for semiconductor devices incorporating quantum dots (QDs) and methods of fabricating the same. As an example, a semiconductor device in accordance with the present disclosure may include a plurality of light-emitting devices that can produce light, such as a first light-emitting device, a second light-emitting device, and a third light-emitting device. The light-emitting devices may be and/or include light-emitting diodes, laser diodes, and/or any other suitable devices capable of producing light. In some embodiments, each of the light-emitting devices may be and/or include a flip-chip light-emitting diode. The light-emitting devices may emit light of a certain color (e.g., blue light).

The semiconductor device may further include a plurality of nanoporous structures corresponding to the light-emitting devices. A respective nanoporous structure may include one or more nanoporous materials comprising pores (e.g., voids) of nanoscale sizes (e.g., a size of the order of 1 nm to 1000 nm or larger) and may include quantum dots placed in the nanoporous materials for converting light produced by one or more of the light-emitting devices corresponding to the nanoporous structure. For example, a first nanoporous structure may include first quantum dots for converting light produced by the first light-emitting device into red light. A second nanoporous structure may include second quantum dots for converting light produced by the second light-emitting device into green light. A third nanoporous structure that does not include quantum dots may correspond to the third light-emitting device. The light produced by the third light-emitting device (e.g., blue light) may pass through the third nanoporous structure. In some embodiments, the nanoporous structures may be separated by one or more trenches coated with a suitable material for preventing and/or reducing optical crosstalk between neighboring nanoporous structures.

In some embodiments, fabricating the semiconductor device may involve fabricating a light-conversion device including the nanoporous structures with embedded quantum dots and attaching the light-conversion device to the light-emitting devices. In such embodiments, the light-conversion device is formed on the light-emitting devices instead of within the light-emitting devices. This may further enhance the color purity, reliability, and the blue to red and blue to green power conversion efficiencies of the semiconductor device described herein. By forming the light-conversion device on the light-emitting devices, the mechanisms described herein may also enable micro-LEDs and other applications that require light-conversion devices with specific dimensions.

According to one or more aspects of the present disclosure, displays incorporating light-conversion devices as described herein and methods for making the displays are provided. Prior solutions for fabricating micro-size light-emitting diodes (e.g., micro-LEDs) based displays typically involve successively singulating micro-LEDs emitting red light (also referred to as the "red micro-LEDs"), micro-LEDs emitting green light (also referred to as the "green micro-LEDs"), and micro-LEDs emitting blue light (also referred to as the "blue micro-LEDs") from their respective native wafers. For example, the prior solutions typically include preparing wafers containing blue micro-LEDs, wafers containing red micro-LEDs, and wafers containing green micro-LEDs, respectively. The blue micro-LEDs, the red micro-LEDs, and the green micro-LEDs are then picked up from their respective wafers for transfer to a display substrate (e.g., a thin-film transistor (TFT) backplane). That is, the blue micro-LEDs, the red micro-LEDs, and the green micro-LEDs are first fabricated on respective wafers and then sorted and transferred to the display substrate separately to form pixels of red micro-LEDs, green micro-LEDs, and blue micro-LEDs. As such, the prior solutions for fabricating micro-LED based displays involve complex processes for singulating, sorting, and transferring blue micro-LEDs, red micro-LEDs, and green micro-LEDs.

The present disclosure provides for methods for fabricating displays that address the above and other deficiencies of the prior solutions. For example, a plurality of micro semiconductor devices emitting light of varying colors may be provided on a first substrate. For example, the micro semiconductor devices may include a first plurality of micro semiconductor devices emitting red light, a second plurality of micro semiconductor devices emitting green light, and a third plurality of micro semiconductor devices emitting blue light. The micro semiconductor devices may correspond to a plurality of pixels. Each of the pixels may include one of the first plurality of micro semiconductor devices, one of the second plurality of micro semiconductor devices, and one of the third plurality of micro semiconductor devices. The first substrate may be and/or include a growth substrate for growing gallium nitride (GaN) and/or other material of light-emitting devices (e.g., light-emitting diodes). For example, the first substrate may include sapphire, silicon carbide (SiC), silicon (Si), quartz, gallium arsenide (GaAs), aluminum nitride (AlN), GaN, etc. In some embodiments, the first substrate may include a silicon wafer comprising CMOS drivers. The pixels formed by the micro semiconductor devices may correspond to pixels of the display.

The micro semiconductor devices may then be transferred from the first substrate to a second substrate (e.g., a display module of a display). In one implementation, the second substrate may comprise a driver circuit (e.g., one or more CMOS drivers, a TFT, etc.). In another implementation, the second substrate does not comprise a driver circuit. The second substrate may comprise a plurality of conductive lines (e.g., rows and/or columns of conductive lines). Transferring the micro semiconductor devices may include separating the micro semiconductor devices and the first substrate (e.g., by picking up the micro semiconductor devices using an array of electrostatic transfer heads, irradiating the plurality of micro semiconductor devices using a laser beam, etc.). The micro semiconductor devices may then be formed on the second substrate. As such, the micro semiconductor devices do not have to be singulated or sorted to be transferred onto the second substrate to fabricate the display.

Examples of embodiments of the present disclosure will be described in more detail with reference to the accompanying drawings. It should be understood that the following embodiments are given by way of illustration only to provide a thorough understanding of the disclosure to those skilled in the art. Therefore, the present disclosure is not limited to the following embodiments and may be embodied in different ways. Further, it should be noted that the drawings are not to precise scale and some of the dimensions, such as width, length, thickness, and the like, can be exaggerated for clarity of description in the drawings. Like components are denoted by like reference numerals throughout the specification.

Referring to FIGS. 1A, 1B, and 1C, structures related to an example process for fabricating a light conversion device in accordance with some embodiments of the present disclosure are illustrated. As shown in FIG. 1A, a solid material 110 may be obtained for fabricating a light conversion device in accordance with the present disclosure. The solid material 110 may be fabricated into a porous structure comprising nanoporous materials (also referred to herein as the "nanoporous structure").

For example, as illustrated in FIG. 1B, the solid material 110 may be fabricated into a porous structure 120. In some embodiments, the porous structure 120 may be fabricated by etching the solid material 110 using chemical etching and/or any other suitable etching technique. The porous structure 120 may include nanoporous materials comprising pores. As shown in FIG. 1B, the porous structure 120 may include a matrix structure 121 comprising the solid material and pores 123. The matrix structure 121 is also referred to as "nanoporous material" herein. Each of the pores 123 may have a nanoscale size (e.g., a size of the order of 1 nm to 1000 nm or larger). The porosity of the porous structure 120 and/or the nanomaterials (e.g., a fraction of the volume of the pores 123 over a total volume of the porous structure 120) can be in a range of 10% to 90%. In some embodiments, the porosity of the porous structure 120 may be between about 10% and about 80%. In some embodiments, a dimension (e.g., a diameter, a depth) of a pore 123 may be equal to or greater than 10 nm. In some embodiments, a diameter of a pore 123 may be between about 5 nm and about 100 nm. In some embodiments, a diameter of a pore 123 may be between about 1 nm and about 500 nm. In some embodiments, a diameter of a pore 123 is not greater than 500 nm. In some embodiments, a diameter of a pore 123 may be between about 10 nm and about 20 nm. In some embodiments, a depth of a pore 123 may be about or greater than 1 μm. The pores 123 may be dispersed in a three-dimensional space.

As illustrated in FIG. 1C, one or more quantum dots (QDs) may be placed into the porous structure 120 to fabricate a light-conversion device 130. For example, the QDs may be loaded into the porous structure 120 by infiltrating a liquid (such as toluene, polydimethylsiloxane (PDMS), etc.) containing QDs into the porous structure 120 and/or the nanoporous materials. As the pores 123 are dispersed in a three-dimensional space, the QDs may be loaded into the three-dimensional space occupied by the pores 123. The liquid containing the QDs may be dispensed on a surface of the porous structure 120. The dispensed liquid may infiltrate into the pores 123. In one implementation, the QDs may be placed in the porous structure 120 and the pores 123 using a dispensing machine that is capable of dispensing liquids and/or fluids including QDs (e.g., dispensing machine 1500 illustrated in FIG. 15).

The QDs may be and/or include semiconductor particles in nanoscale sizes (also referred to as "nanoparticles"). Each of the QDs may include any suitable semiconductor material that may be used to produce a QD for implementing light conversion devices in accordance with the present disclosure, such as one or more of ZnS, ZnSe, CdSe, InP, CdS, PbS, InP, InAs, GaAs, GaP, etc. Multiple QDs placed in the porous structure 120 may or may not include the same semiconductor material.

Each of the QDs may have a suitable core-shell structure that may include a core and/or one or more shells. The core and the shells may or may not include the same semiconductor material. As an example, one or more of the QDs may have a core comprising a suitable semiconductor material. As another example, one or more of the QDs may have a core comprising a first semiconductor material (e.g., CdS) and a shell comprising a second semiconductor material (e.g., ZnS). As a further example, one or more of the QDs may have a core (e.g., a CdSe core) and multiple shells (e.g., a first shell comprising ZnSe, a second shell comprising ZnS). Multiple QDs placed in the porous structure may or may not have the same core-shell structures.

When excited by electricity or light, a QD may emit light of a certain wavelength and/or a range of wavelengths (also referred to as the "emission wavelength" of the QD). More particularly, for example, the QD may absorb one or more photons with a wavelength shorter than the emission wavelength of the QD. Different QDs (e.g., QDs of various shapes, sizes, and/or materials) may emit light with various wavelengths. For example, a relatively larger QD may emit light with a relatively longer wavelength, while a relatively smaller QD may emit light with a relatively shorter wavelength.

In some embodiments, QDs of various emission wavelengths may be placed in the porous structure and/or nanoporous materials to achieve a mixed color emission. For example, as shown in FIG. 1C, the QDs placed in the porous structure 120 may include one or more QDs 131 with a first emission wavelength (also referred to as the "first QDs"), one or more QDs 133 with a second emission wavelength (also referred to as the "second QDs"), one or more QDs 135 with a third emission wavelength (also referred to as the "third QDs"), etc. QDs 131, 133, and/or 135 may have different sizes, shapes, compositions, etc. to achieve different emission wavelengths. QDs 131, 133, and/or 135 may or may not contain different materials. In one implementation, QDs 131, 133, and/or 135 contain different semiconductor materials.

When excited by light 141, the first QDs may convert light 141 to light 143 with the first emission wavelength. The second QDs may convert the light 141 to light 145 with the second emission wavelength. The third QDs may convert the light 141 to light 147 with the third emission wavelength. The light 141 may be produced by any light source that is capable of producing light. Examples of the light source may include one or more light-emitting diodes, laser diodes, etc. In some embodiments, light 141 may have a wavelength that is not longer than the first emission wavelength, the second emission wavelength, and/or the third emission wavelength. In some embodiments, light 141 may be and/or include white light. Light 143, 145, and 147 may have different colors (e.g., red light, green light, blue light). In some embodiments, the color purity of each of light 143, 145, and 147 may be about or higher than 99%. In some embodiments, the color purity of each of light 143, 145, and 147 may be about or higher than 99.9%.

As shown in FIG. 1C, the first QDs, the second QDs, and the third QDs may be placed in various portions of the porous structure 120 (e.g., a first portion, a second portion, and a third portion of the porous structure 120, respectively). Each of the portions of the porous structure may include multiple layers of QDs loaded in a three-dimensional space that was formed by one or more portions of the pores 123.

In accordance with one or more aspects of the present disclosure, a light conversion device is provided. The light conversion device may include a porous structure and a plurality of QDs placed in the porous structure. The porous structure may include one or more nanoporous materials. The nanoporous materials and/or the porous structure may include a matrix structure comprising one or more semiconductor materials (Si, GaN, AlN, etc.), glass, plastic, metal, polymer, etc. The nanoporous materials and/or the porous structure may further include one or more pores and/or voids.

The plurality of QDs may include QDs of various emission wavelengths, such as one or more first QDs with a first emission wavelength (also referred to herein as the "first plurality of QDs"), one or more second QDs with a second emission wavelength (also referred to herein as the "second plurality of QDs"), one or more third QDs with a third emission wavelength (also referred to herein as the "third plurality of QDs"), etc. The first QDs, the second QDs, and the third QDs may or may not have the same size, shape, and/or material. In some embodiments, one or more of the first QDs may have a first size and/or a first shape. One or more of the second QDs may have a second size and/or a second shape. One or more of the third QDs may have a third size and/or a third shape. In one implementation, the first size may be different from the second size and/or the third size. In one implementation, the first shape may be different from the second shape and/or the third shape. In one implementation, one or more of the first QDs, the second QDs, and/or the third QDs may include different materials.

The light conversion device may convert light of a certain wavelength into light of one or more desired wavelengths (e.g., may convert light of a shorter wavelength to light of longer wavelength(s)). In some embodiments, the light conversion device may convert light of a first color into one or more of light of a second color, light of a third color, light of a fourth color, etc. The first color, the second color, the third color, the fourth color may correspond to a first wavelength, a second wavelength, a third wavelength, and a fourth wavelength, respectively. In some embodiments, the first color is different from the second color, the third color, and/or the fourth color. In some embodiments, the second color, the third color, and the fourth color may correspond to a red color, a green color, and a blue color, respectively. In some embodiments, the light of the first color comprises violet light.

Referring to FIG. 1D, an example 150 of a light-conversion device in accordance with some embodiments of the present disclosure is shown. As illustrated, the light-conversion device 150 may include a plurality of QDs placed in a nanoporous structure and a protection structure 155. The QDs may include QDs 131, 133, and 135 as described in connection with FIG. 1C. The nanoporous structure may be and/or include the porous structure 120 of FIG. 1B. As described above, the nanoporous structure may include nanoporous materials 121 and pores 123.

The protection structure may include one or more materials (e.g., organic materials, inorganic materials) and may protect the QDs from oxygen, water, moisture, and/or other environmental factors. The protection structure may also prevent chemical degradation of the QDs and may enhance the stability of the light conversion device.

In some embodiments, the protection structure 155 may include a first protection layer 155a that covers the surfaces of the QDs placed in the nanoporous structure. The first protection layer 155a may be and/or include a coating on surfaces of the QDs in the nanoporous structure. As an example, the protection layer 155a can be formed by spinning coating or spraying the liquid-phase of the protection layer on the surface of porous structure. The liquid-phase protection layer can then flow inside the nanoporous structure. The coating may include one or more suitable materials that may prevent oxidation of the QDs and/or protect the QDs from other environmental factors, such as polydimethylsiloxane (PDMS), poly(methylmethacrylate) (PMMA), epoxy, etc. In some embodiments, as shown in FIG. 1D, the first protection layer 155a may also include a layer of the first material formed on the nanoporous structure. It is to be noted that the coating of the covering the QDs is not shown in FIG. 1D.

The protection structure 155 may further include a protection layer 155b (also referred to as the "second protection layer"). The protection layer 155b may include one or more materials that may protect the QDs from oxygen, moisture, and/or other environmental factors. For example, the protection layer 155b may include one or more layers of $SiO_2$, SiN, $Al_2O_3$, PDMS, PMMA, etc. The protection layer 155b may be formed on the protection layer 155a to provide further protection for the QDs in the light-conversion device. The protection layers 155a and 155b may or may not contain the same material.

In one implementation, the protection layer 155a and/or the coating of the QDs include a first material. The protection layer 155b includes a second material that is different from the first material. Examples of the first material may include PDMS, PMMA, epoxy, etc. Examples of the second material may include $SiO_2$, SiN, $Al_2O_3$, etc. In another implementation, the protection layers 155a-155b and/or the coating of the QDs may include a common material.

Figure 2A:
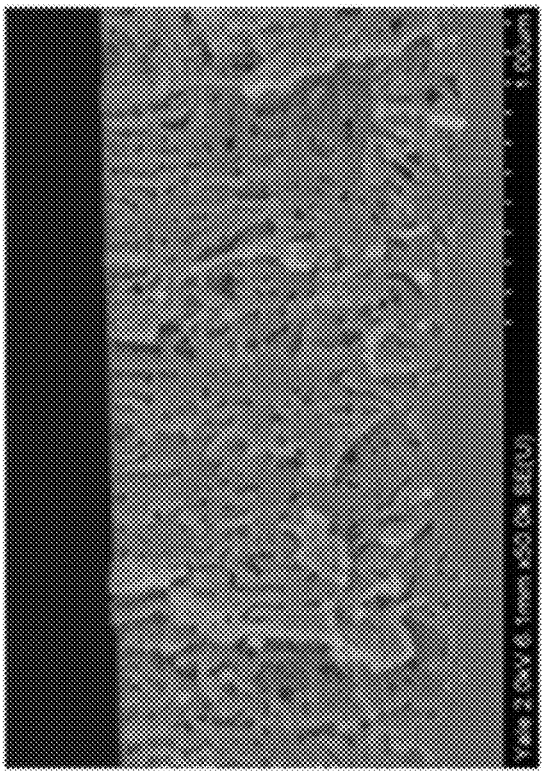
FIG. 2A is a cross-sectional Scanning Electron microscopy (SEM) image of an example light conversion device in accordance with one or more aspects of the present disclosure.

FIG. 2A is a cross-sectional SEM image of an example light conversion device in accordance with one or more aspects of the present disclosure. The light conversion device may comprise a porous structure comprising GaN (nanoporous GaN), and QDs placed in the porous structure and/or the nanoporous GaN. As illustrated, when excited by input light having a wavelength of about 420 nm, the light conversion device may convert the input light into red light.

FIG. 2B depicts a PL spectrum of an example light conversion device in accordance with one or more aspects of the present disclosure. As shown, the light conversion device can convert input light having a wavelength of about 420 nm into green light (e.g., light with an emission wavelength of 650 nm).

FIGS. 3A, 3B, 3C, 3D, and 3E illustrate examples 300a, 300b, 300c, 300d, and 300e of semiconductor devices according to some embodiments of the present disclosure, respectively. The semiconductor device may include a light-conversion device as described herein. The semiconductor device can be used to fabricate light-emitting diodes, laser diodes, transistors, solar cells, and/or any other suitable semiconductor devices. The semiconductor device can be used to implement display applications, lighting applications, data storage applications, power electronic applications, communication applications, etc. The semiconductor device may be and/or include a flip-chip structure LED, a vertical structure LED, a lateral structure LED, etc. The semiconductor device may be and/or include a light-emitting device that is capable of emitting light. In some embodiments, the semiconductor device may have dimensions on the scale of micrometers (also referred to as the "micro semiconductor device").

Figure 3A:
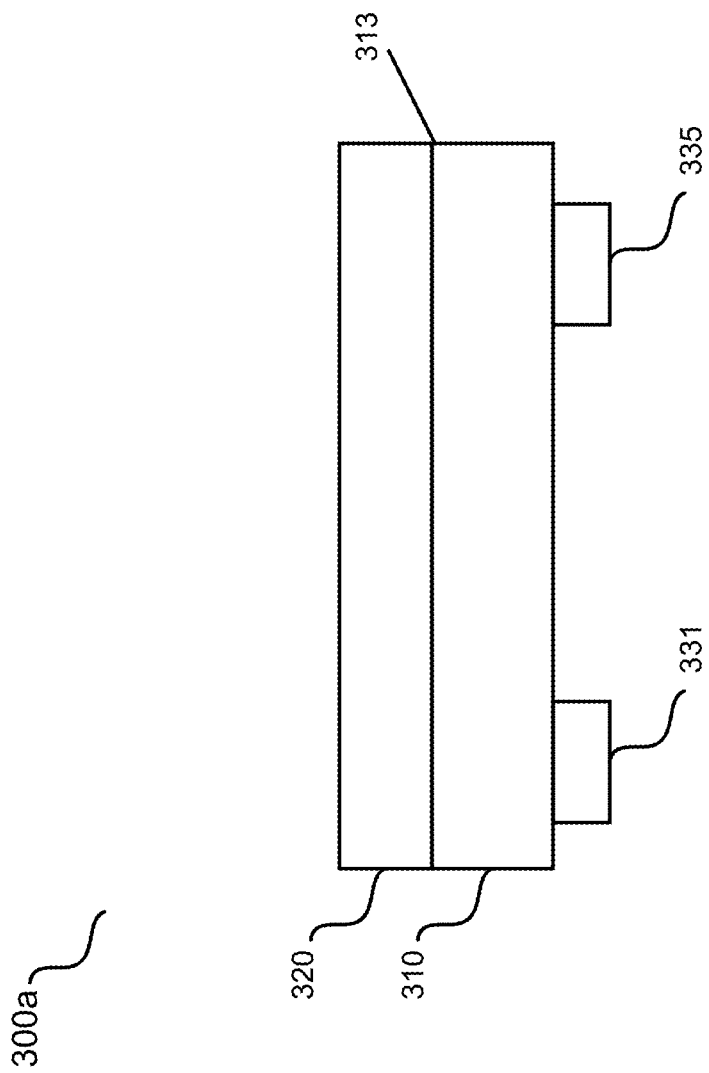
FIGS. 3A, 3B, 3C, 3D, and 3E are schematic diagrams illustrating examples of semiconductor devices incorporating quantum dots according to some embodiments of the present disclosure.
Figure 3B:
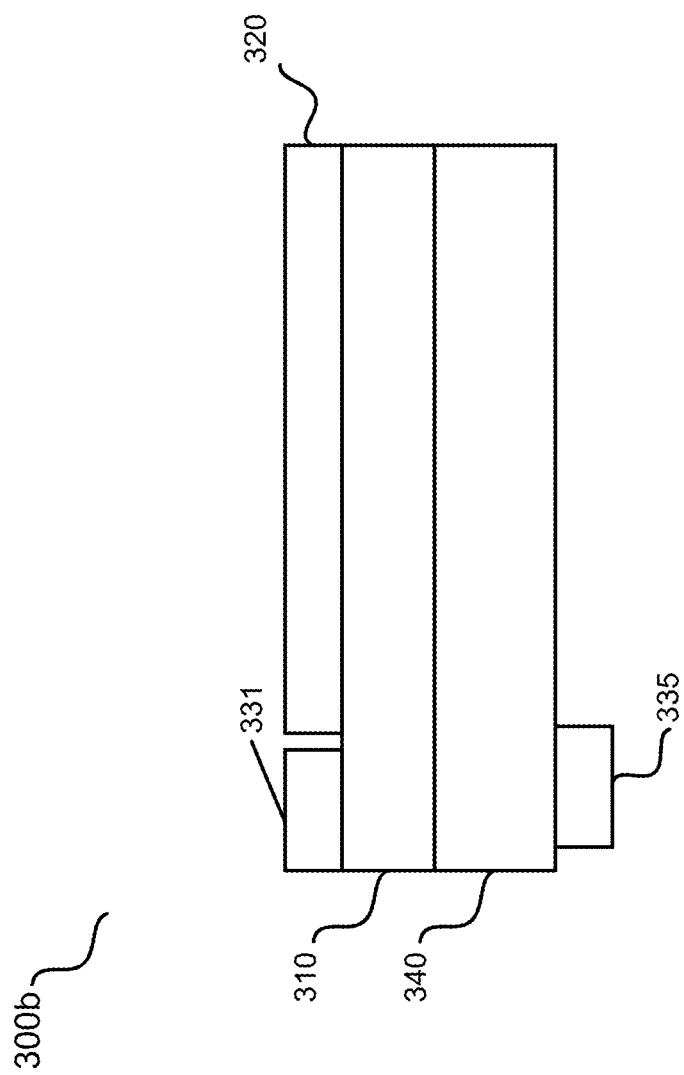

As illustrated in FIGS. 3A and 3B, the semiconductor device 300a and/or 300b may include a light-emitting structure 310, a light-conversion device 320, ohmic contacts 331 and 335, and/or any other suitable component for implementing a light-emitting device in accordance with the present disclosure.

The light-emitting structure 310 may include one or more layers of semiconductor materials and/or any other suitable material for producing light. For example, the light-emitting structure 310 may include one or more epitaxial layers of a group III-V material (e.g., GaN), one or more quantum well structures, etc. In some embodiments, the light-emitting structure 310 may include one or more components described in conjunction with FIG. 4A.

The light-conversion device 320 may be and/or include QDs placed in one or more nanoporous structures as described in conjunction with FIGS. 1A-2B.

The ohmic contacts 331 and 335 (e.g., an n-pad and a p-pad) may be deposited on the light-emitting structure 310.

Figure 4A:
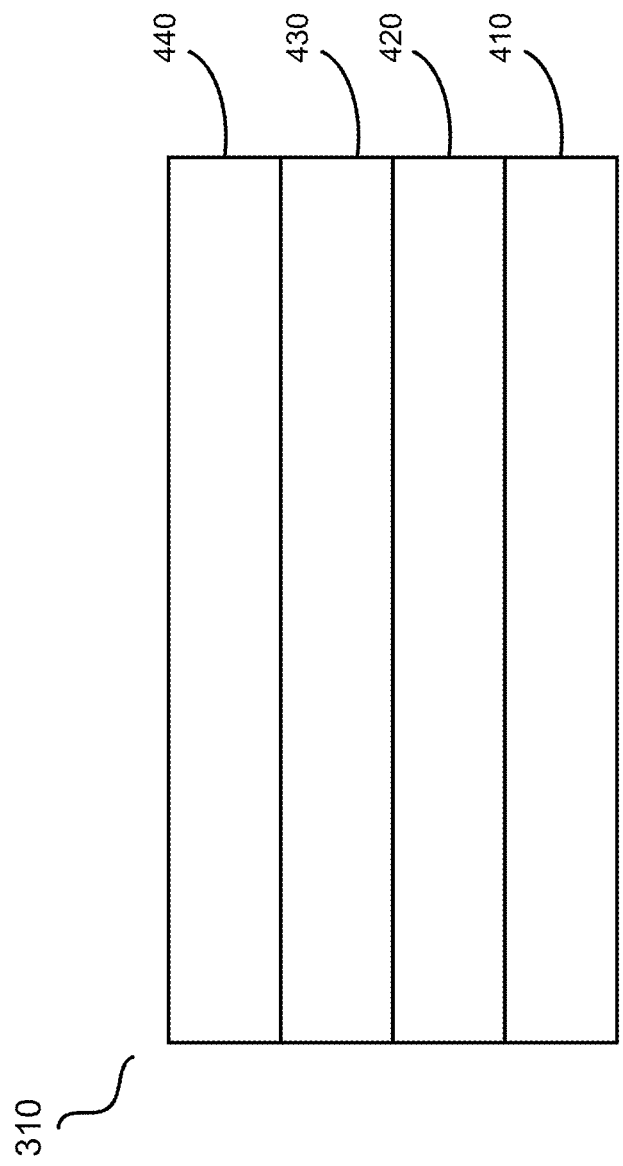
FIG. 4A is a schematic diagram illustrating an example light-emitting structure according to some embodiments of the present disclosure.

The ohmic contact 331 may be deposited on an n-doped layer (e.g., layer 420 of FIG. 4A). The ohmic contact 335 may be deposited on a p-doped layer (e.g., layer 440 of FIG. 4A). The ohmic contacts 331 and 335 may include any suitable metal. For example, the ohmic contacts 331 and 335 may include nickel (Ni) and gold (Au), respectively.

In one implementation, the ohmic contacts 331 and 335 may be deposited on the same side of the light-emitting structure 310. For example, as illustrated in FIG. 3A, the ohmic contacts 331 and 335 may be deposited on a first side of the light-emitting structure 310. The light-conversion device 320 and/or the porous structure of the light-conversion device 320 may be formed on a second side of the light-emitting structure 310 that is opposite to the first side. In some embodiments, the formation of the light conversion device may include fabricating the light conversion device by performing one or more operations as described in connection with FIGS. 1A-1D and 5A-5B and/or other aspects of the present disclosure. Alternatively or additionally, as will be discussed in greater detail below, the formation of the light conversion device may include attaching the fabricated light conversion device to the light-emitting structure 310 (e.g., by gluing the light conversion device to the light-emitting structure and/or using any other suitable technology that may attach the light conversion device to the light-emitting structure). In some embodiments, the semiconductor device 300a may include one or more components described in connection with FIGS. 4B-4C below.

In another implementation, the ohmic contacts 331 and 335 may be deposited on different sides of the light-emitting structure 310 to form a vertical light-emitting structure. The vertical light-emitting structure may enable current flows from a p-type ohmic contact to an n-type ohmic contact in a vertical direction (e.g., between opposite surfaces and/or sides of the semiconductor device 300b, such as an upper surface and a bottom surface). For example, as illustrated in FIG. 3B, the ohmic contacts 331 and 335 may be deposited on opposite sides of the light-emitting structure 310. The light-conversion device 320 and the first ohmic contact 331 may be formed on the same side of the light-emitting structure 310. The semiconductor device 300b may also include a support structure 340. The support structure 340 may include a metallic structure mounted with suitable bonding materials (e.g., an Au—Sn alloy). The metallic structure may include Si, W, Ta, and/or any other suitable material. The support structure 340 may support the semiconductor device 300b as a mechanic support structure and/or substrate.

The light-conversion device 320 may be formed on the light-emitting structure 310. For example, as illustrated in FIG. 3A, the light-conversion device 320 may be formed on a surface 313 corresponding to a first side of the light-emitting structure 310. The ohmic contacts 331 and 335 are formed on one or more surfaces of the light-emitting structure 310 that correspond to a second side of the light-emitting structure 310. The first side and the second side may correspond to opposite sides of the light-emitting structure 310 (e.g., a top side and a bottom side). As another example, as illustrated in FIG. 3B, the ohmic contact 331 and light-conversion device 320 are formed on the first side of the light-emitting structure 310, while the ohmic contact 335 is disposed on the second side of the light-emitting structure 310.

The light-conversion device 320 may or may not be in direct contact with the light-emitting structure 310. In some embodiments, the light-conversion device 320 and/or the porous structure of the light-conversion device 320 is not in direct contact with the light-emitting structure 310. For example, the light-emitting structure and the porous structure may be separated by a space. As another example, a support layer may be formed between the light-emitting structure and the light-conversion device. The support layer may comprise $Al_2O_3$, GaN, and/or any other suitable material.

In some embodiments, one or more sidewalls of the semiconductor device 300 may be coated with one or more reflective materials for reflecting light produced by the semiconductor device 300 back toward the semiconductor device 300. The one or more reflective materials may include metals, such as Ag, Al, Ni, Ti, etc.

Figure 3C:
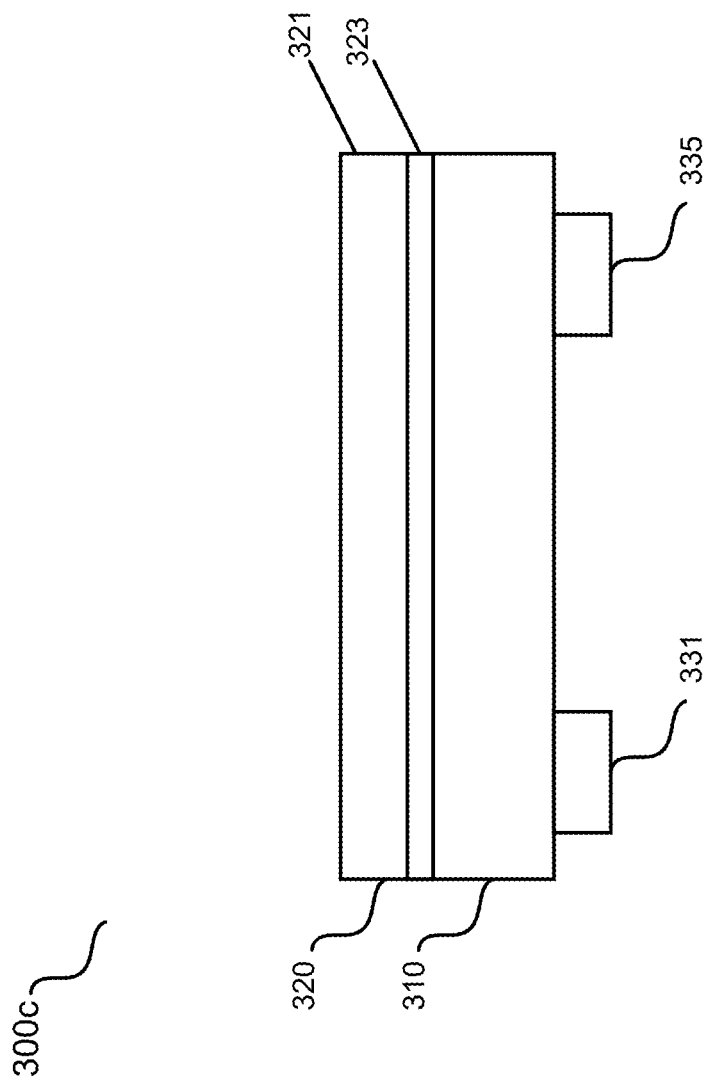

In some embodiments, the light-conversion device 320 of FIGS. 3A and 3B may include a protection structure for protecting the QDs. For example, as illustrated in FIG. 3C, a semiconductor device 300c in accordance with the present disclosure may include the light-emitting structure 310, the light-conversion device 320, and the ohmic contacts 331 and 335. The light-emitting device 300c may include a nanoporous structure 321 with embedded QDs and a protection structure 323. The QDs may include QDs 131, 133, and/or 135 as described in connection with FIG. 1C. In some embodiments, the QDs include QDs 131 and 133, as described in connection with FIG. 1C. The nanoporous structure 321 may be and/or include the porous structure 120 of FIG. 1B. As described above, the nanoporous structure 321 may include nanoporous materials 121 and pores 123. The protection structure 323 may be and/or include a protection structure 155 as described in connection with FIG. 1D.). In some embodiments, the semiconductor device 300c may include one or more components described in connection with FIGS. 4B-4C below.

In some embodiments, one or more scattering media may be positioned between the light-conversion device 320 and the light-emitting structure 310 to further increase internal scattering and effective pathways of light traveling in the semiconductor device and may thus further improve the light conversion efficiency of the light-conversion device disclosed herein. The scattering media 350a may include any suitable material that may cause scattering of one or more portions of light produced by the light-emitting structure 310. For example, the scattering media may include $SiO_2$, SiN, polymers, Xerogels, etc. The scattering media may include one or more porous materials (e.g., porous $SiO_2$, porous SiN, Xerogels, etc.). In some embodiments, the porous materials may include pores having a dimension of 52-400 nanometers. The scattering media can be formed by chemical etching, a physical film coating process, and/or using any other suitable technique. In some embodiments, a thickness of the scattering media may be between 1 μm to 1 mm.

Figure 3D:
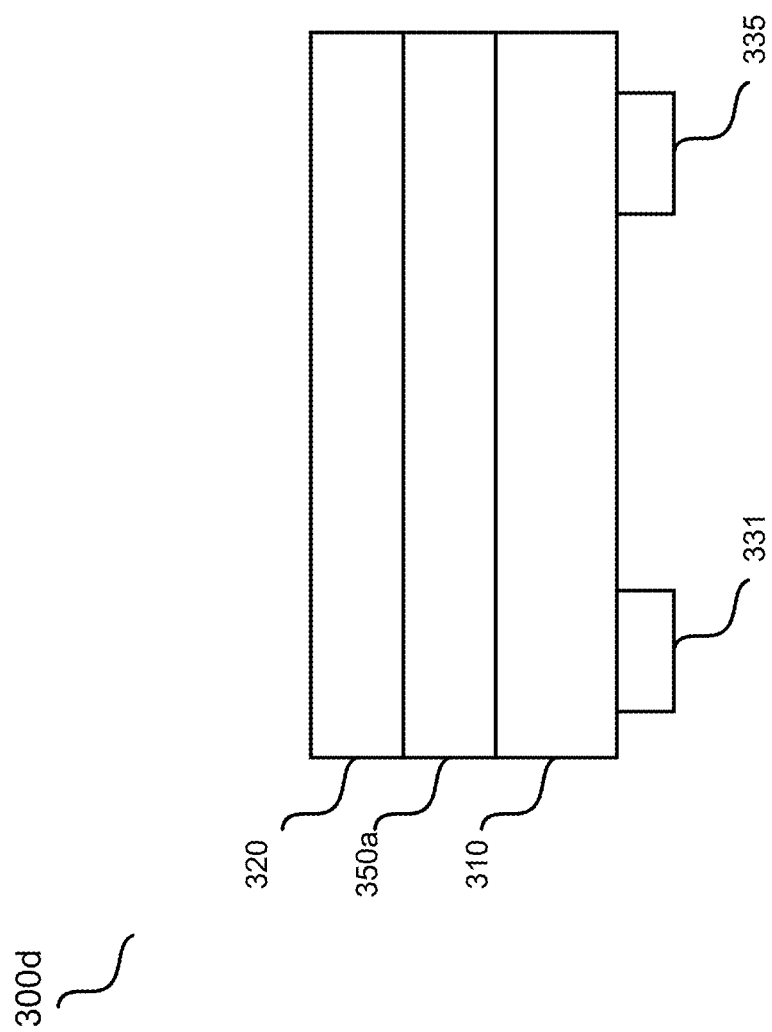

As an example, as illustrated in FIG. 3D, semiconductor device 300d may include the light-emitting structure 310, the light-conversion device 320, scattering media 350a, and/or any other suitable component. In some embodiments, the semiconductor device 300d may include one or more components described in connection with FIGS. 4D-4E below.

Figure 3E:
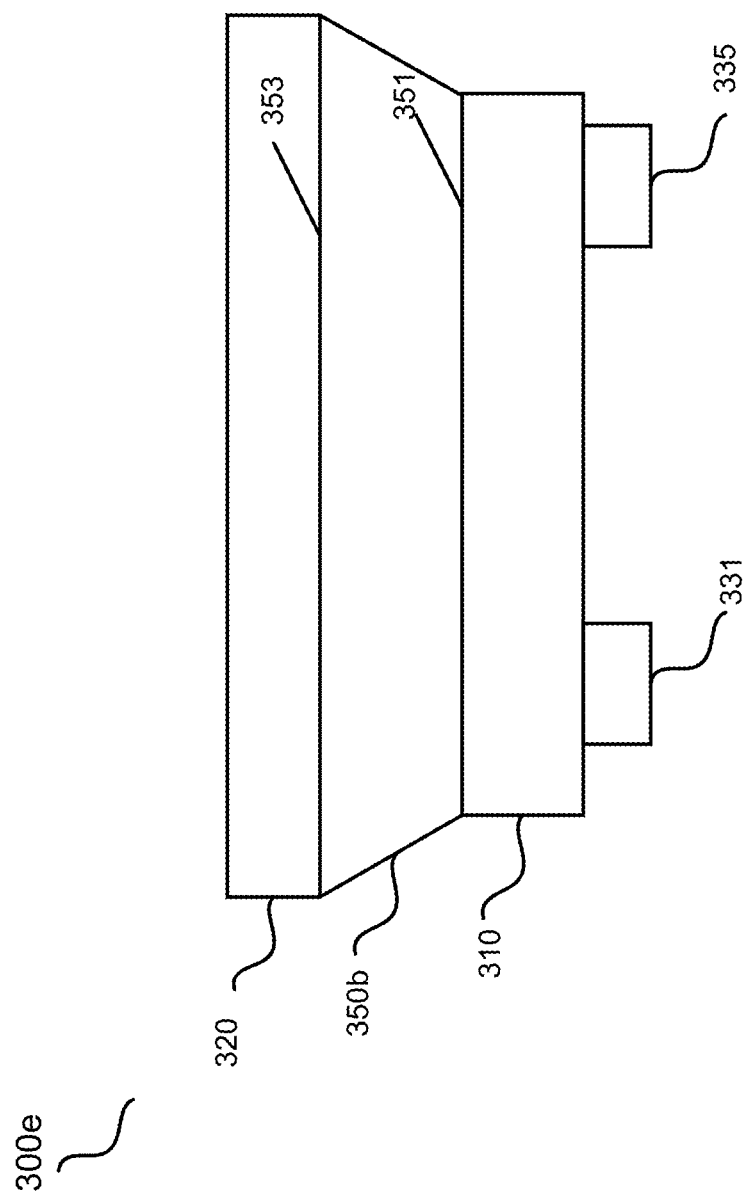

In some embodiments, the scattering media may have a size and/or shape different from that of the light-emitting structure 310 and/or the light-conversion device 320. For example, one or more dimensions of the scattering media (e.g., a length, width, height, etc.) may be greater than that of the light-emitting structure 310. As a more particular example, as illustrated in FIG. 3E, the scattering media 350b may be positioned on a surface 351 of the light-emitting structure 310. The light-conversion device 320 may be formed on a surface 353 of the scattering media 350b. The sizes of the surfaces 351 and 353 may be different. In some embodiments, the surface 353 is larger than the surface 351. The surface 351 may correspond to surface 411 of FIG. 4F and/or the surface 415 of FIG. 4G. The surface 353 may correspond to surface 413 of FIG. 4F and/or the surface 417 of FIG. 4G. In some embodiments, the scattering media described herein may be regarded as being part of the light-conversion device 320. In some embodiments, the semiconductor device 300e may include one or more components described in connection with FIGS. 4F-4G below.

Referring to FIG. 4A, an example of the light-emitting structure 310 according to some embodiments of the present disclosure is illustrated. As shown, the light-emitting structure 310 may include a growth template 410, a first semiconductor layer 420, a second semiconductor layer 430, and a third semiconductor layer 440.

The growth template 410 may include one or more epitaxial layers of the group III-V material to be grown on the growth template 410 and/or a foreign substrate. The foreign substrate may contain any other suitable crystalline material that can be used to grow the group III-V material, such as sapphire, silicon carbide (SiC), silicon (Si), quartz, gallium arsenide (GaAs), aluminum nitride (AlN), etc. In some embodiments, the light-emitting structure 310 does not include the growth template 410.

The first semiconductor layer 420 may include one or more epitaxial layers of group III-V materials and any other suitable semiconductor material. For example, the first semiconductor layer 420 may include an epitaxial layer of a group III-V material (also referred to as the "first epitaxial layer of the group III-V material"). The group III-V material may be, for example, GaN. The first epitaxial layer of the group III-V material may include the group III-V material doped with a first conductive type impurity. The first conductive type impurity may be an n-type impurity in some embodiments. The first epitaxial layer of the group III-V material may be a Si-doped GaN layer or a Ge-doped GaN layer in some embodiments. The first semiconductor layer 420 may also include one or more epitaxial layers of the group III-V material that are not doped with any particular conductive type impurity.

The second semiconductor layer 430 may include one or more layers of semiconductor materials and/or any other suitable material for emitting light. For example, the semiconductor layer 430 may include an active layer comprising one or more quantum well structures for emitting light. Each of the quantum well structures may be and/or include a single quantum well structure (SQW) and/or a multi-quantum well (MQW) structure. Each of the quantum well structures may include one or more quantum well layers and barrier layers (not shown in FIG. 4A). The quantum well layers and barrier layers may be alternately stacked on one another. The quantum well layers may comprise indium (e.g., indium gallium nitride). Each of the quantum well layers may be an undoped layer of indium gallium nitride (InGaN) that is not intentionally doped with impurities. Each of the barrier layers may be an undoped layer of the group III-V material that is not intentionally doped with impurities. A pair of a barrier layer (e.g., a GaN layer) and a quantum well layer (e.g., an InGaN layer) may be regarded as being a quantum well structure. The second semiconductor layer 430 may contain any suitable number of quantum well structures. For example, the number of the quantum well structures (e.g., the number of pairs of InGaN and GaN layers) may be 3, 4, 5, etc.

When energized, the second semiconductor layer 430 may produce light. For example, when an electrical current passes through the active layer, electrons from the first semiconductor layer 420 (e.g., an n-doped GaN layer) may combine in the active layer with holes from the third semiconductor layer 440 (e.g., a p-doped GaN layer). The combination of the electrons and the holes may generate light. In some embodiments, the second semiconductor layer 430 may produce light of a certain color (e.g., light with a certain wavelength).

The third semiconductor layer 440 may include one or more epitaxial layers of the group III-V material and/or any other suitable material. For example, the third semiconductor layer 440 can include an epitaxial layer of the group III-V material (also referred to as the "second epitaxial layer of the group III-V material"). The second doped layer of the group III-V material may be doped with a second conductive type impurity that is different from the first conductive type impurity. For example, the second conductive type impurity may be a p-type impurity. In some embodiments, the second epitaxial layer of the group III-V material may be doped with magnesium.

While certain layers of semiconductor materials are shown in FIG. 4A, this is merely illustrative. For example, one or more intervening layers may or may not be formed between two semiconductor layers of FIG. 4A (e.g., between the first semiconductor layer 420 and the second semiconductor layer 430, between the second semiconductor layer 430 and the third semiconductor layer 440, etc.). In one implementation, a surface of the first semiconductor layer 420 may directly contact a surface of the second semiconductor layer 430. In another implementation, one or more intervening layers (not shown in FIG. 4A) may be formed between the first semiconductor layer 420 and the second semiconductor layer 430. One or more intervening layers (not shown in FIG. 4A) may be formed between the first semiconductor layer 420 and the growth template 410. In some embodiments, the first semiconductor layer 420 may include an undoped layer of the group III-nitride material. In some embodiments, the semiconductor device 310 can include one or more layers of semiconductor materials and/or any other material that are formed on the third semiconductor layer 440.

Turning to FIGS. 4B-4G, examples 400b, 400c, 400d, 400e, 400f, and 400g of semiconductor devices including a flip-chip light-emitting structure in accordance with some embodiments of the present disclosure are illustrated. As shown in FIGS. 4B and 4C, ohmic contacts 331 and 335 may be deposited on a surface of the semiconductor layer 420 and a surface of the semiconductor layer 440, respectively. In some embodiments, as shown in FIG. 4B, the light-conversion device 320 may be formed on the growth template 410. As an example, one or more epitaxial layers comprising GaN or other suitable material may be grown on the growth template 410. One or more nanoporous structures may then be formed in the epitaxial layers of GaN (e.g., by forming one or more nanoporous structures as described in connection with FIGS. 1A-1D). Suitable QDs may be loaded into the nanoporous structures as described above. As another example, one or more nanoporous structures comprising nanoporous materials (e.g., a semiconductor material, glass, plastic, metal, polymer, etc.) may be formed on the growth template 410. The nanoporous structures may or may not be in direct contact with the growth template 410. In one implementation, the nanoporous structures are in direct contact with the growth template 410. In another implementation, the nanoporous structures are not in direct contact with the growth template 410. For example, the nanoporous structures and the growth template 410 may be separated by a space. As another example, one or more layers of a group III-V material (e.g., GaN) and/or any other suitable material (also referred to as the "support layer") may be formed on the growth template 410. The nanoporous structures may be formed on the support layer. The growth template 410 may also be regarded as being part of the support layer in some embodiments. In some embodiments, the formation of the light-conversion device 320 may include attaching the light-conversion device 320 to layers 410 and/or 420 (e.g., by mounting the light-conversion device 320 to layers 410/420 and/or the scattering media).

In some embodiments, as shown in FIG. 4C, the growth template 410 may be removed from the light-emitting structure 310 prior to the formation of the light-conversion device 320 on the semiconductor device 300. For example, one or more nanoporous structures may be formed in one or more portions of the first semiconductor layer 420 (e.g., by etching a portion of the n-GaN layer to form nanoporous structures). As another example, one or more nanoporous structures comprising nanoporous materials (e.g., a semiconductor material, glass, plastic, metal, polymer, etc.) may be formed on the first semiconductor layer 420. The nanoporous structures may or may not be in direct contact with the first semiconductor layer 420. In one implementation, the nanoporous structures are in direct contact with the first semiconductor layer 420. In another implementation, the nanoporous structures are not in direct contact with the first semiconductor layer 420. For example, the nanoporous structures and the first semiconductor layer 420 may be separated by a space. As another example, one or more layers of a group III-V material (e.g., GaN) and/or any other suitable material (also referred to as the "support layer") may be formed on the first semiconductor layer 420. The nanoporous structures may be formed on the support layer.

Figure 4G:
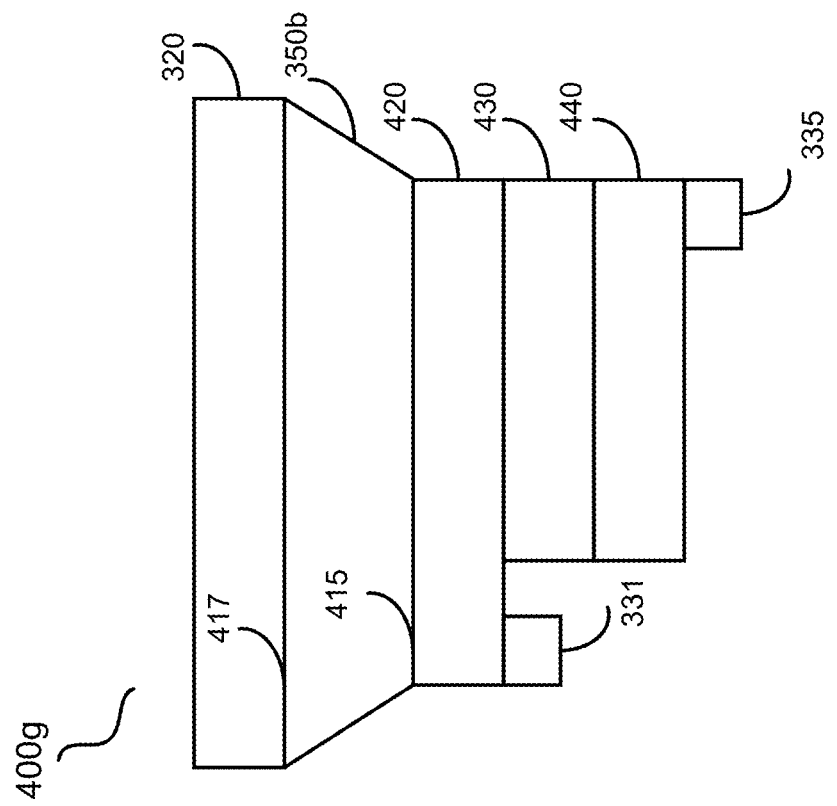
Figure 4F:
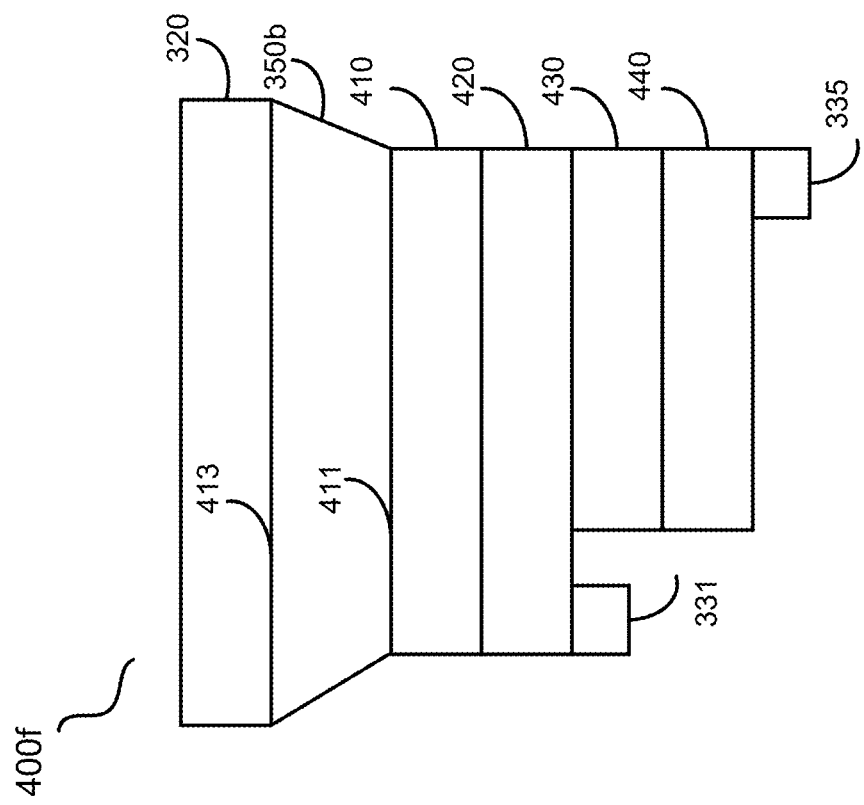

Referring to FIGS. 4D, 4E, 4F, and 4G, examples of semiconductor devices including scattering media according to some embodiments of the present disclosure are illustrated. As shown in FIGS. 4D and 4F, the scattering media 350a and/or 350b as described in connection with FIGS. 3D and 3E may be positioned between the growth template 410 and the light-conversion device 320. In some embodiments, one or more intervening layers of semiconductor materials and/or any other suitable material may be formed between the scattering media 350 and the growth template 410.

As shown in FIGS. 4E and 4G, the scattering media as described in connection with FIGS. 3D and 3E may be positioned between the first semiconductor layer 420 and the light-conversion device 320. In some embodiments, one or more intervening layers of semiconductor materials and/or any other suitable material may be formed between the scattering media 350 and the first semiconductor layer 420.

As shown in FIGS. 4F and 4G, the scattering media may have a size and/or shape different from that of the light-conversion device 320 and/or the light-emitting structure of the semiconductor device (e.g., the layers 420, 430, 440, the growth template 410, ohmic contacts 331 and 335, etc.). For example, one or more dimensions of the scattering media 350b may be greater than that of the light-emitting structure. As a more particular example, as illustrated in FIG. 4F, the scattering media 350b may be positioned on a surface 411 of the growth template 410. The light-conversion device 320 may be formed on a surface 413 of the scattering media 350b. The sizes of surfaces 411 and 413 may be different. In some embodiments, the surface 413 is larger than the surface 411. As another more particular example, as illustrated in FIG. 4G, the scattering media 350b may be positioned on a surface 415 of the first semiconductor layer 420. The light-conversion device 320 may be formed on a surface 417 of the scattering media 350b. The sizes of the surfaces 415 and 417 may be different. In some embodiments, the surface 417 is larger than the surface 415.

Referring to FIGS. 5A-5E, example structures and processes for fabricating semiconductor devices incorporating quantum dots placed in nanoporous structures according to some embodiments of the present disclosure is provided. Each of the semiconductor devices may be and/or include a light-emitting device that can emit light.

Figure 5A:
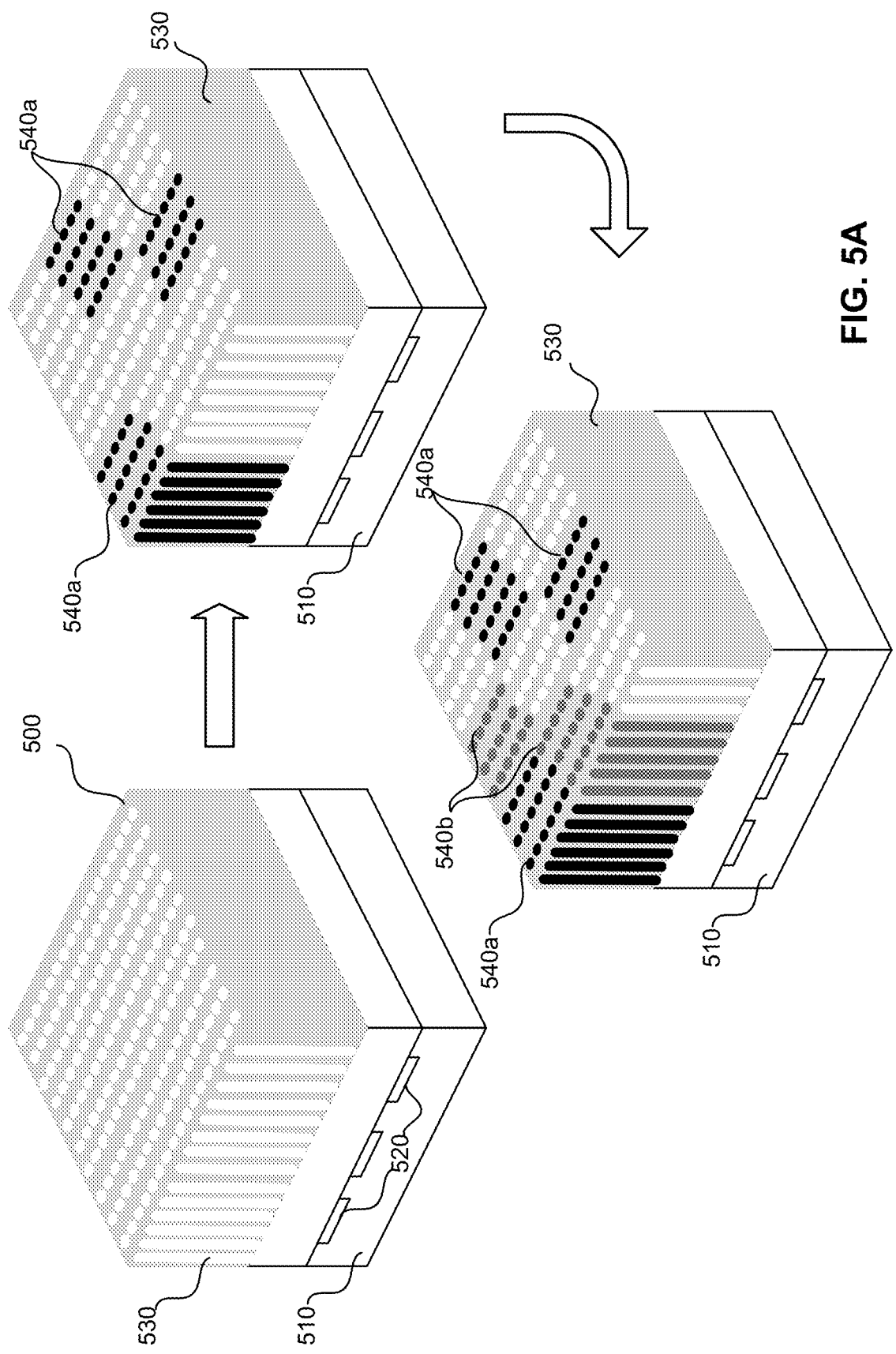
FIGS. 5A, 5B, 5C, 5D, and 5E, are schematic diagrams illustrating example structures and processes for fabricating semiconductor devices incorporating quantum dots placed in nanoporous structures according to some embodiments of the present disclosure.

As illustrated in FIG. 5A, a semiconductor device 500 may include one or more light-conversion devices as disclosed herein. As illustrated, a plurality of light-emitting devices (LEDs) 520 (e.g., one or more arrays of LEDs) may be formed on a driver circuit 510 of the semiconductor device 500. Each of the LEDs 520 may include a light-emitting structure 310 of FIG. 3. In some embodiments, the LEDs may be monolithic LEDs that can produce light of a certain color (e.g., blue LEDs).

The driver circuit 510 may be and/or include one or more electrical circuits for enabling individual electronic control of the LEDs 520. In some embodiments, the driver circuit 510 may include one or more CMOS drivers.

A nanoporous structure 530 may be formed on one or more of the LEDs 520. The nanoporous structure 530 may include one or more nanoporous materials. In one implementation, the nanoporous structure 530 may be formed by electrochemically etching one or more of the LEDs 520 (e.g., by etching the n-GaN layer(s) of one or more of the LEDs 520). In some embodiments, one or more of the LEDs 520 are not electrochemically etched.

Quantum dots may be loaded into the nanoporous structure. The quantum dots may include quantum dots of various emission wavelengths (e.g., the first QDs, the second QDs, the third QDs, etc. as described above). In some embodiments, the quantum dots may be loaded using a photolithography method, an inkjet printing method, etc. As an example, QDs 540a and 540b may be loaded in respective portions the nanoporous structure 530 to produce various emission colors. QDs 540a and 540b may have different emission wavelengths. For example, QDs 540a may convert the light produced by 520 to red light. QDs 540b may convert the light produced by LEDs 520 to green light.

According to one or more aspects of the present disclosure a display device comprising micro-LEDs and methods for fabricating the display device are provided. The display device may be of any suitable size and may be used in any suitable computing device (e.g., a watch, glasses, contact lenses, a mobile phone, a head-mounted display, a tablet computing device, a laptop, a desktop, a television, an augmented reality (AR) device, a virtual reality (VR) device, etc.). The display device may include one or more light-conversion devices as described herein. The display device may include micro semiconductor devices that may emit light of various colors (e.g., red, green, blue, etc.). Each of the micro semiconductor devices may have dimensions on the scale of micrometers and may include a semiconductor device 300a-300b as described in connection with FIGS. 3A-4G. In one implementation, a dimension (e.g., a lateral dimension) of a micro semiconductor device may be approximately 5-25 μm. In another implementation, a dimension (e.g., a lateral dimension) of the micro semiconductor device may be greater than 25 μm or smaller than 5 μm.

Figure 5B:
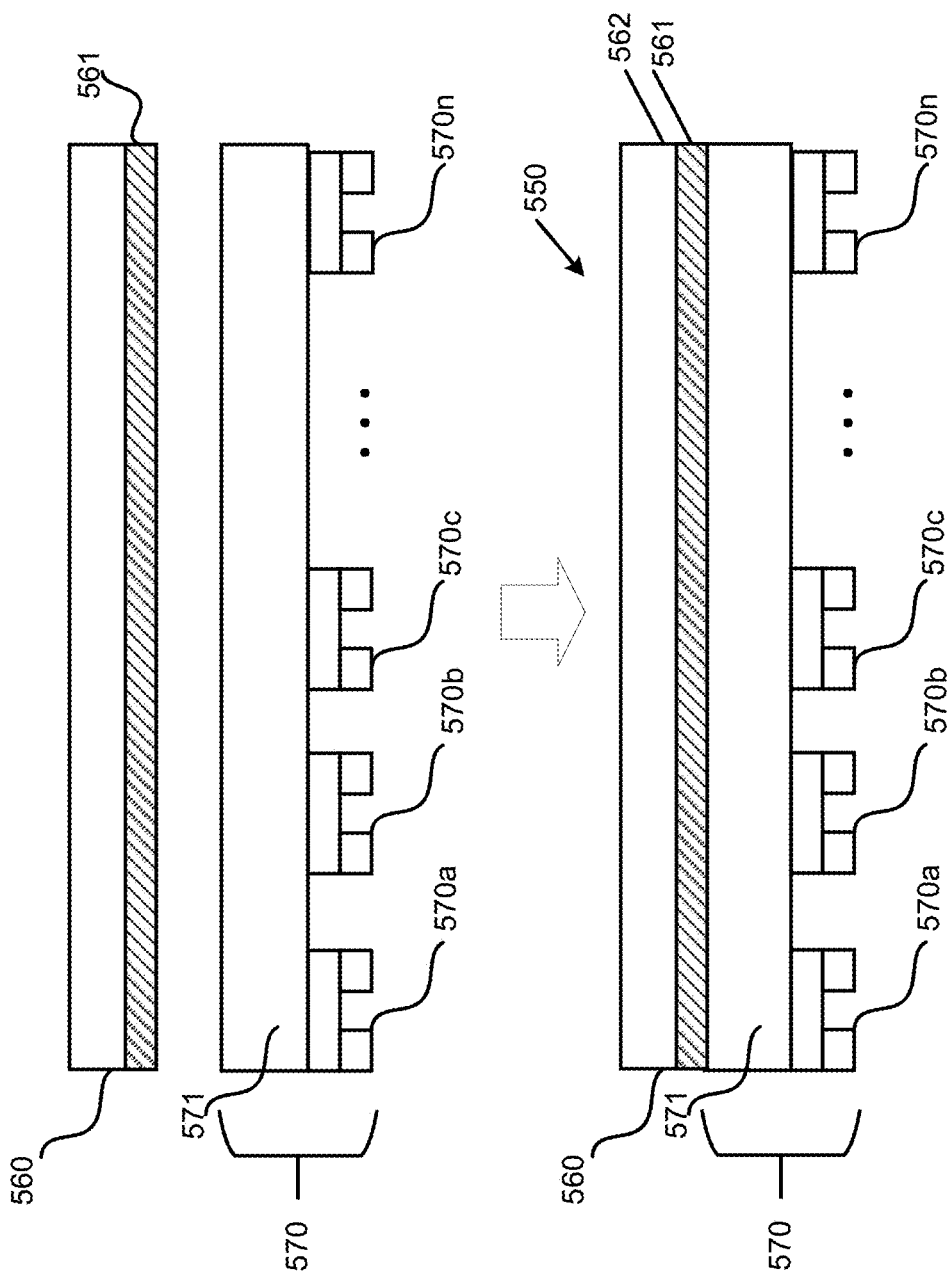

Turning to FIG. 5B, structures and processes for fabricating a semiconductor device 550 in accordance with some embodiments of the present disclosure are illustrated. The semiconductor device 550 may include a light-conversion device 560, a light-emitting structure 570, and/or any other suitable component.

The light-conversion device 560 may include a porous structure 561 with embedded quantum dots. The porous structure 561 may be and/or include, for example, the light-conversion device 130, 150, and/or 320 as described above. The embedded quantum dots may convert light produced by the light-emitting structure 570 into light of certain wavelengths and/or colors. In some embodiments, the embedded quantum dots have a certain wavelength and may convert light provided by the light-emitting structure 570 to a certain color (e.g., a blue color, a green color, a red color). The light-conversion device 560 may further include a layer 562 of one or more solid materials, such as a semiconductor material (e.g., an n-GaN layer, an undoped GaN layer, etc.). In some embodiments, the light-conversion device 560 may include one or more scattering media 355a-b and/or protection structures 155 as described above. In some embodiments, the solid material 562 and/or one or more portions of the solid material 562 may be removed from the porous structure 561 to form the semiconductor device 550.

The light-emitting structure 570 may include one or more light-emitting devices that can emit light. In some embodiments, the light-emitting structure 570 may include a plurality of light-emitting devices 570a, 570b, 570c, . . . , 570n. Each of the light-emitting devices 570a-n may be and/or include a light-emitting diode, a laser diode, etc. In some embodiments, each of the light-emitting devices 570a-n may be and/or include a micro-size light-emitting diode (LED) (also referred to as the "micro-LED"). The micro-LED may have dimensions on the scale of micrometers. In one implementation, a dimension of the micro-LED may be approximately 5-25 μm. In another implementation, a dimension of the micro-LED may be greater than 25 μm or smaller than 5 μm. A pixel pitch between two light-emitting devices 570a, 570b, 570c, . . . , 570n (e.g., two adjacent light-emitting devices 570a-n) may be 20 μm, 25 μm, or of any other suitable value. In some embodiments, the pixel pitch may be equal to or greater than 20 μm. The pixel pitch may represent a distance between the light-emitting devices (e.g., a distance between a center of a first light-emitting device and a center of a second light-emitting device, a distance between a side of the first light-emitting device and a side of the second light-emitting device, etc.).

The light-emitting devices 570a-n may be formed on a substrate 571 in some embodiments. The substrate 571 may be and/or include a growth substrate for fabricating and/or supporting the light-emitting devices 570a-n. For example, the substrate 571 may include sapphire, silicon carbide (SiC), silicon (Si), quartz, gallium arsenide (GaAs), aluminum nitride (AlN), gallium nitride (GaN), etc. In some embodiments, the substrate 571 may be and/or include a free-standing gallium-nitride substrate that does not include a foreign substrate. In some embodiments, the substrate 571 may include a silicon wafer comprising CMOS drivers.

The light-emitting devices 570a-n may be arranged in one or more arrays (e.g., one or more columns and/or rows). Each of the light-emitting devices 570a-n may include one or more components of a light-emitting structure 310 of FIGS. 3A-4G and may include one or more ohmic contacts. In some embodiments, one or more of the light-emitting devices 570a-n may be monolithic LEDs that can emit light of a certain color (e.g., blue LEDs). One or more of the light-emitting devices 570a-n may be micro-LEDs. In some embodiments, each of the light-emitting devices 570a-n may include a flip-chip structure as described herein. While a certain number of light-emitting devices are illustrated in FIG. 5B, this is merely illustrative. It is to be noted that the light-emitting structure 570 may include any suitable number of light-emitting devices.

Figure 5C:
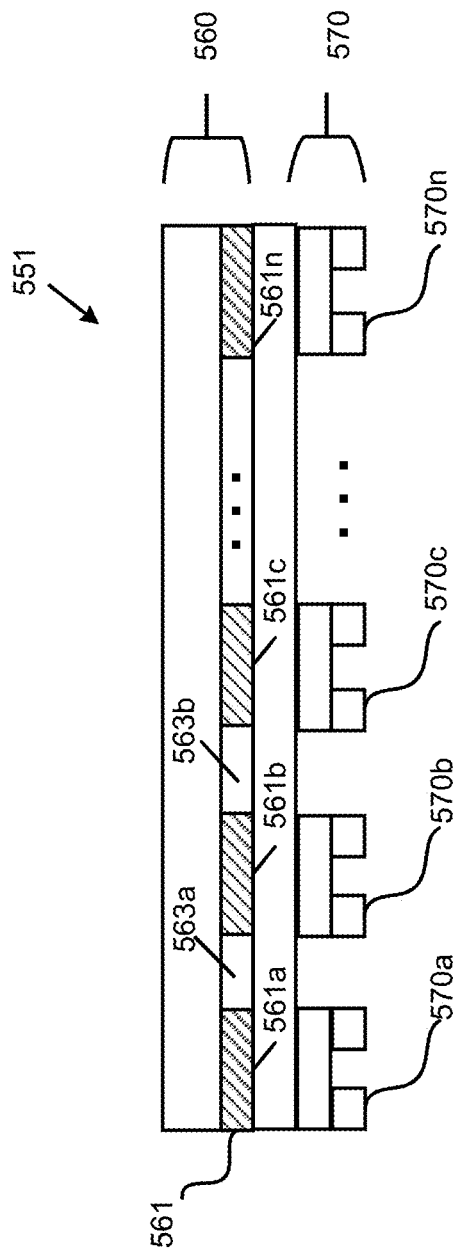

In some embodiments, as illustrated in FIG. 5C, the light-conversion device 560 and/or the porous structure 561 that may be divided into one or more portions 561a, 561b, 561c, . . . , 561n in a semiconductor device 551. The portions 561a-n are also referred to as nanoporous structures 561a-n herein. Each of the nanoporous structures 561a-n may be and/or include a porous structure 120 as described in connection with FIGS. 1A-1B above. Each of the nanoporous structures 561a-n may include a plurality of pores. Each of the pores may have a nanoscale size. A first plurality of quantum dots (e.g., the first quantum dots 131 of FIG. 1C) may be placed in a first plurality of pores in nanoporous structure 561a. A second plurality of quantum dots (e.g., the second quantum dots 135 of FIG. 1C) may be placed in a second plurality of pores in nanoporous structure 561b. In one implementation, the third quantum dots may be placed in nanoporous structure 561c. In another implementation, no quantum dots are placed in nanoporous structure 561c.

In some embodiments, a distance between two adjacent nanoporous structures and/or portions of the light-conversion device 560 (e.g., 561a and 561b) may be about or less than 20 μm. In some embodiments, a dimension of a nanoporous structure 561a-n may be about or less than 100 μm. For example, each nanoporous structure 561a-n may be represented by a square having a side of about or less than 100 μm. In some embodiments, a dimension of a nanoporous structure 561a-n may be about or less than 50 μm. For example, each nanoporous structure 561a-n may be represented by a square having a side of about or less than 50 μm. A dimension of each of the trenches may be about or less than 2 μm.

As shown, the nanoporous structure 561a-n may be separated by a plurality of structures 563a, 563b, etc. that may eliminate and/or reduce optical crosstalk between nanoporous structures 561a-n. In some embodiments, structures 563a, 563b, etc. may include materials that may eliminate and/or reduce the optical crosstalk (e.g., metals). In some embodiments, one or more of the structures 563a, 563b, etc. may be and/or include a trench coated with a suitable material for preventing and/or reducing optical crosstalk between adjacent and/or neighboring nanoporous structures 561a-n, such as a metallic material comprising aluminum, nickel, and/or any other suitable metal.

In accordance with some embodiments of the present disclosure, methods for fabricating the semiconductor device 550 may include providing the light-conversion device 560, providing the light-emitting structure 570 that can emit light, attaching the light-emitting structure to the light-conversion device, and/or any other suitable operation. Attaching the light-emitting structure to the light-conversion device may include bonding the light-emitting structure to the light-conversion device using glue or any other suitable technique (e.g., by bonding the porous structure 561 and/or scattering media to the substrate 571).

Figure 5D:
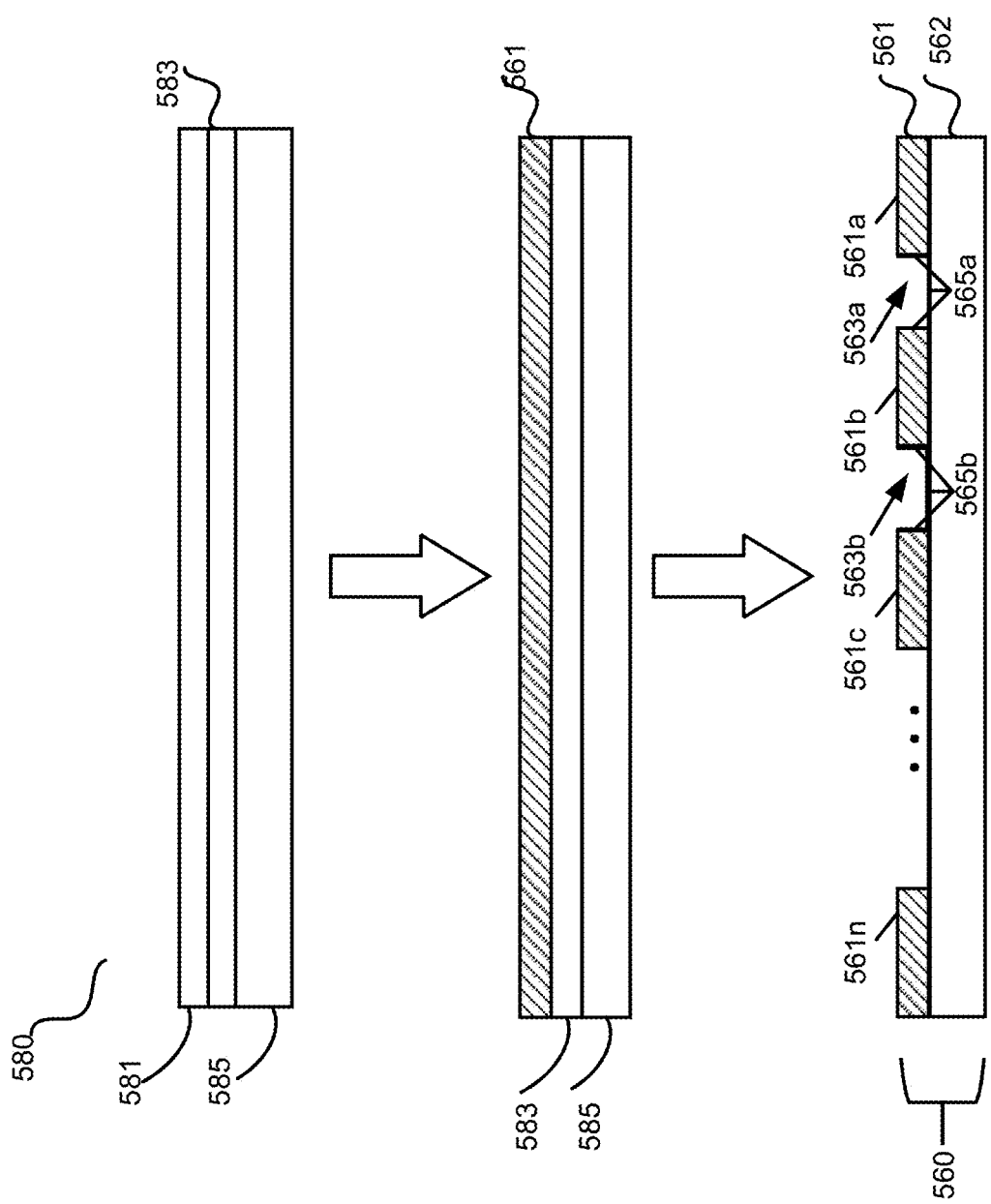

In some embodiments, providing the light-conversion device 560 may include fabricating the light-conversion device 560 by performing one or more operations described above in connection with FIGS. 1A-2B. As an example, providing the light-conversion device 560 may include providing a solid material 580 for forming a nanoporous structure comprising nanoporous materials. In some embodiments, providing the solid material 580 may include providing one or more epitaxial layers of GaN or any other suitable semiconductor material. For example, as shown in FIG. 5D, the solid material 580 may include an n-doped layer 581 of a semiconductor material (e.g., an n-GaN layer), an undoped layer 583 of the semiconductor material (e.g., an undoped GaN layer), and/or one or more layers comprising the semiconductor material and/or any other suitable material. In some embodiments, layers 581 and/or 583 may be grown on a growth template 585. The growth template 585 may include a foreign substrate, one or more layers of the semiconductor material, and/or any other suitable component. The foreign substrate may contain any other suitable crystalline material that can be used to grow the semiconductor material. In some embodiments, the foreign substrate may include sapphire, SiC, Si, quartz, GaAs, AN, and/or any other suitable material for growing GaN and/or any other suitable group III-V material.

As illustrated in FIG. 5D, a porous structure 561 may be formed using the solid material 580. For example, the porous structure 561 may be formed by electrochemically etching one or more portions of the solid material 580 (e.g., by etching one or more portions of layer 581). In some embodiments, one or more portions of layer 581 are not electrochemically etched. In some embodiments, layer 583 and/or growth template 585 and/or one or more portions of layer 583 and/or growth template 585 may be removed from the solid material 580 to form the light-conversion device 560.

Quantum dots may be placed in the porous structure 561 using any suitable technique described herein. The quantum dots may include one or more first quantum dots with a first emission wavelength (e.g., the first quantum dots 131 of FIG. 1C), one or more second quantum dots with a second emission wavelength (e.g., the second quantum dots 135 of FIG. 1C), etc. The first quantum dots and the second quantum dots may be placed into a first portion and a second portion of the porous structure 561, respectively. For example, as shown in FIG. 5D, the light-conversion device 560 may be divided into a plurality of portions comprising nanoporous structures 561a, 561b, 561c, . . . , 561n. The nanoporous structures 561a-n may be formed, for example, by etching the porous structure 561 to form the trenches 563a, 563b, etc.

The trenches 563a, 563b, etc. may be coated with a suitable material for preventing and/or reducing optical crosstalk between neighboring portions of the light-conversion device, such as a metallic material comprising aluminum, nickel, and/or any other suitable metal. For example, as shown in FIG. 5D, the sidewalls and/or the bottom sides of trench 563a may be coated with a coating 565a. The sidewalls and/or the bottom sides of trench 563b may be coated with a coating 565b. In some embodiments, one or more of coatings 565a, 565b, etc. may cover a portion of a nanoporous structure adjacent to the trench. For example, as shown in FIG. 5D, coating 565b may cover a portion of porous structure 561c and/or a portion of porous structure 561b (e.g., about 1 μm).

Figure 5E:
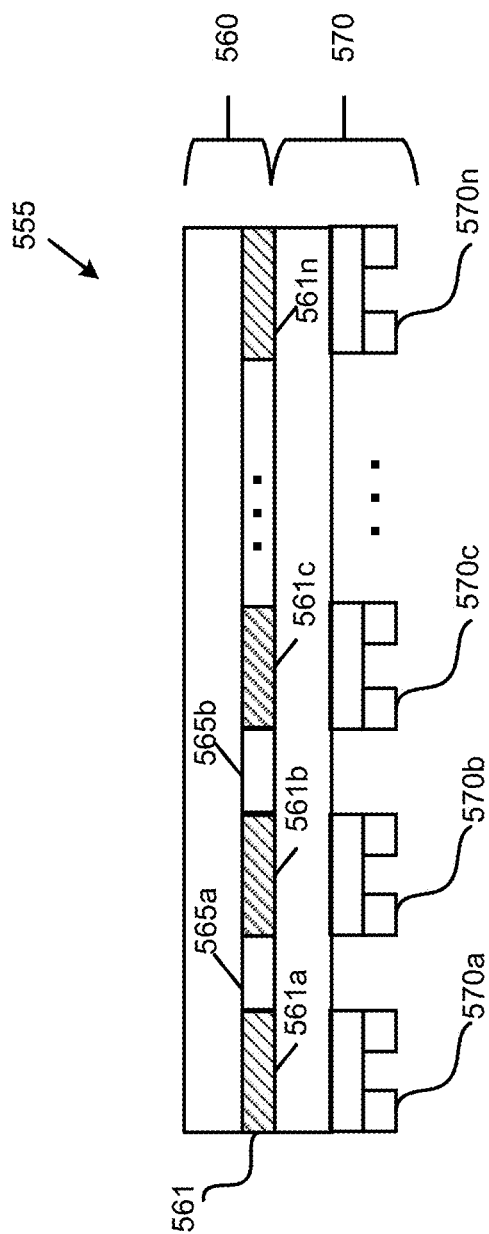

Referring to FIG. 5E, a schematic diagram illustrating a semiconductor device 555 in accordance with some embodiments of the present disclosure is shown. The semiconductor device 555 may include the light-conversion device 560, the light-emitting structure 570, and/or any other suitable component.

The light-emitting structure 570 may include light-emitting devices 570a-570n as described in connection with FIG. 5C. The light-emitting devices 570a-n may correspond to nanoporous structures 561a-n, respectively. The first quantum dots in the nanoporous structure 561a may convert the light produced by light-emitting device 570a into light of a first color (e.g., red light). The second quantum dots in the nanoporous structure 561b may convert the light produced by light-emitting device 570b into light of a first color (e.g., green light). The light produced by light-emitting device 570c (e.g., blue light) may pass through the nanoporous structure 561c.

In some embodiments, the semiconductor device 555 may further include the protection structure 155 as described in connection with FIG. 1D (not shown in FIG. 5E). The protection structure 155 may be positioned between the nanoporous structures 561a-n and the light-emitting structure 570.

Figure 16:
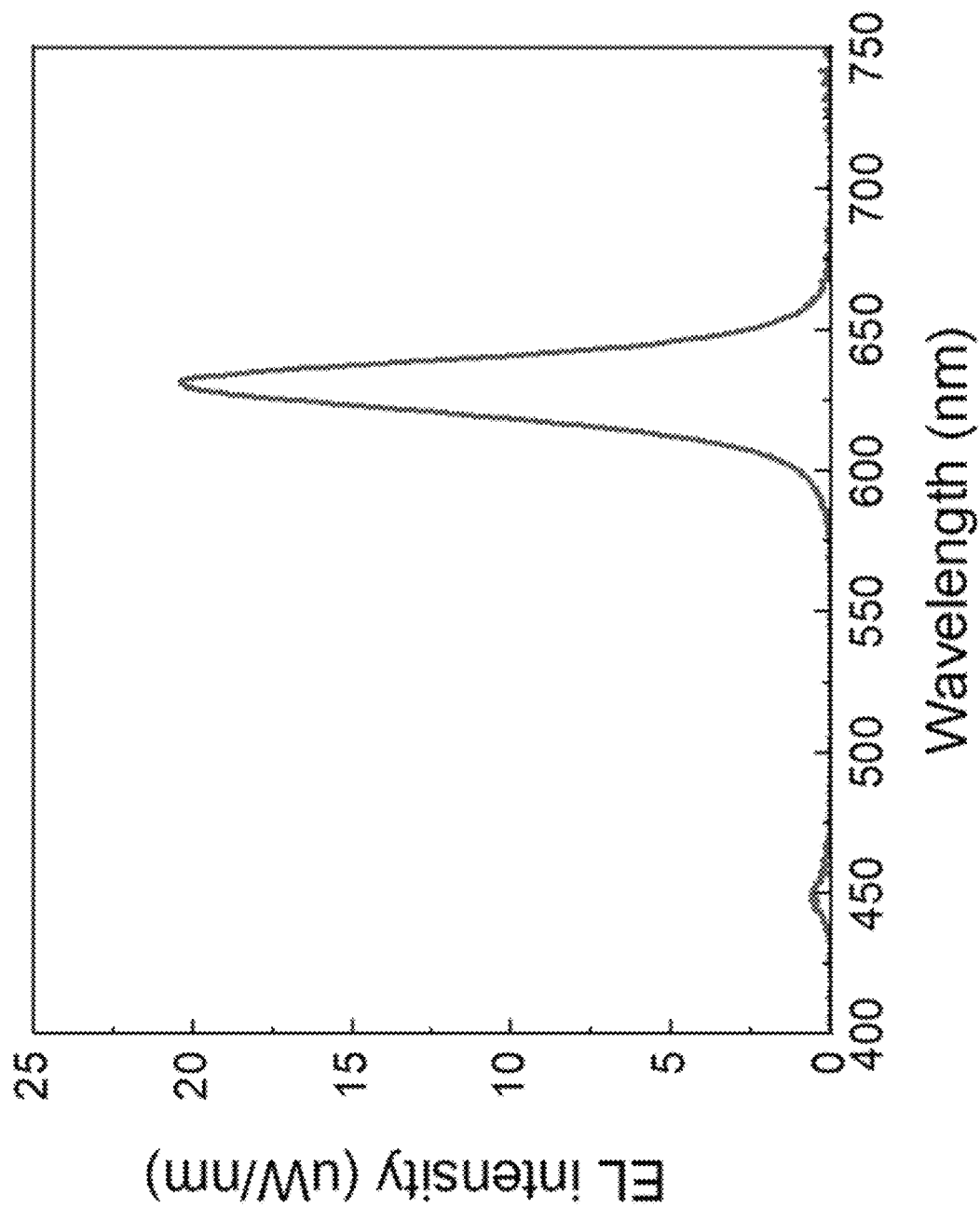
FIG. 16 is an electro-luminescence (EL) intensity-wavelength graph of an example semiconductor device in accordance with some embodiments of the present disclosure.

As described herein, the light-conversion device 560 and/or the porous structure 561 may be formed on the light-emitting structure 570, for example, by attaching the light-conversion device to the light-emitting structure 570. This may further enhance the color purity and the blue to red and blue to green power conversion efficiencies of the semiconductor device 555. For example, as shown in FIG. 16, the color purity of a semiconductor device as described herein may be about or greater than 99%. The formation of the light-conversion device 560 on the light-emitting devices 570a-n may also enable micro-LEDs and other applications that require light-conversion devices with specific dimensions. In some embodiments, a thickness of a light-conversion device described herein (e.g., light-conversion device 320, 555) may be about or greater than 4 μm. In some embodiments, a thickness of a light-conversion device described herein may be about or greater than 10 μm. In some embodiments, a thickness of a light-conversion device described herein may be between about 1 μm and about 100 μm.

Figure 6:
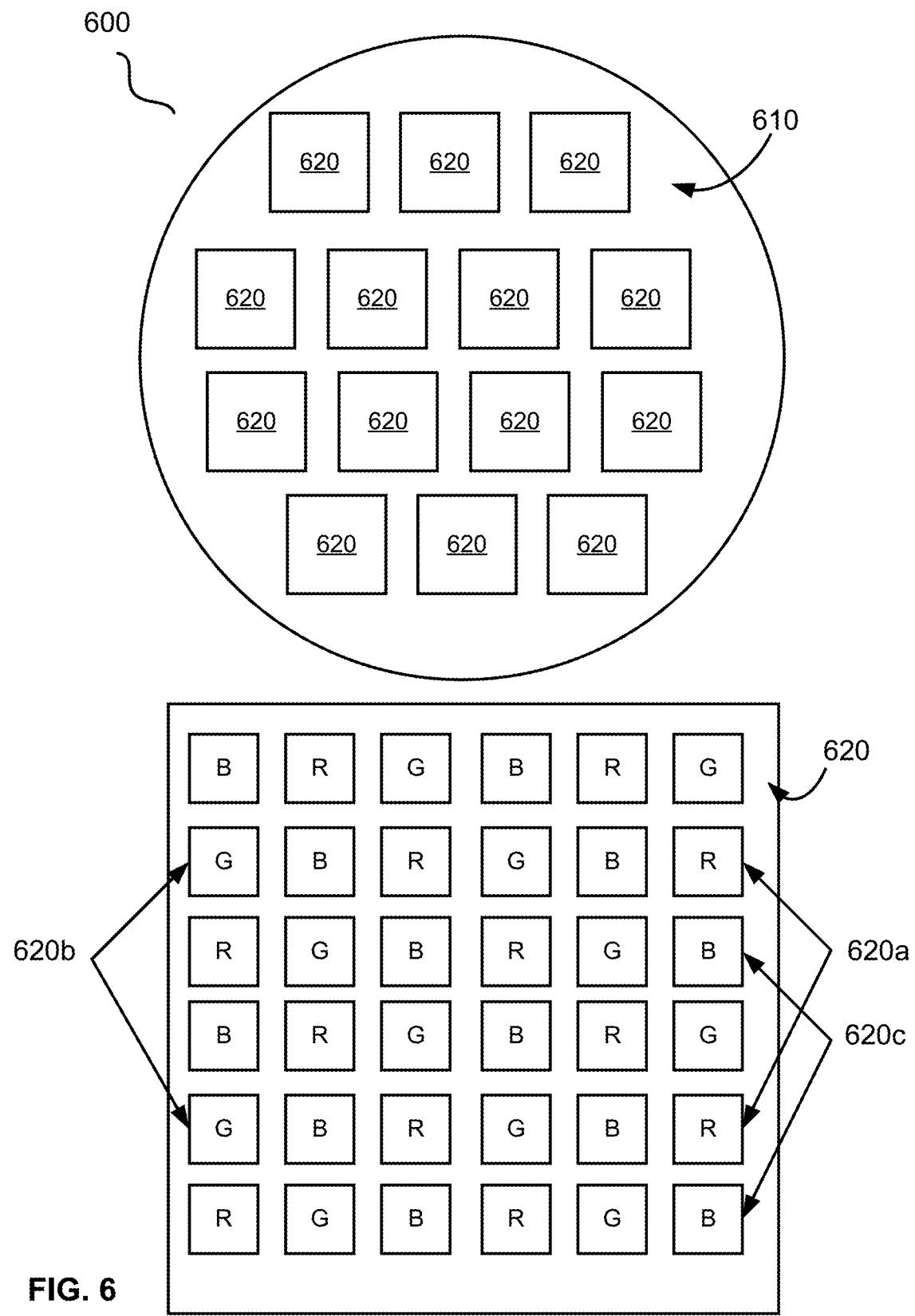
FIG. 6 depicts a schematic diagram illustrating an example of a semiconductor device comprising micro-semiconductor devices.

FIG. 6 depicts a schematic diagram illustrating an example 600 of a semiconductor device comprising light-emitting devices according to some embodiments of the present disclosure. As shown, semiconductor device 600 may include a plurality of micro semiconductor devices 620 provided on a substrate 610. Each of the micro semiconductor devices may be and/or include a semiconductor device as described in conjunction with FIGS. 3A-4G above. In some embodiments, the substrate 610 may be and/or include a growth substrate for growing GaN and/or any other material of the light-emitting structure. For example, the first substrate may include sapphire, silicon carbide (SiC), silicon (Si), quartz, gallium arsenide (GaAs), aluminum nitride (AlN), etc. In some embodiments, the substrate 610 may include a silicon wafer comprising CMOS drivers.

The micro semiconductor devices 620 may emit light of varying colors (e.g., red, green, blue, etc.). For example, as illustrated in FIG. 6, a first set of the micro semiconductor devices 620a may emit light of a first color (also referred to as the "first plurality of micro semiconductor devices"). A second set of the micro semiconductor devices 620b may emit light of a second color (also referred to as the "second plurality of micro semiconductor devices"). A third set of the micro semiconductor devices 620c may emit light of a third color (also referred to as the "third plurality of micro semiconductor devices"). In some embodiments, the first color, the second color, and the third color may be a red color, a green color, and a blue color, respectively.

One or more of the micro semiconductor devices 620 may include a light-conversion device as described herein. For example, the first plurality of micro semiconductor devices may include first QDs with a first emission wavelength (QDs that can convert light incident on the QDs to red light). The second plurality of micro semiconductor devices may include second QDs with a second emission wavelength (QDs that can convert light incident on the QDs to green light). The third plurality of micro semiconductor devices may include third QDs with a third emission wavelength (QDs that can convert light incident on the QDs to blue light). The first QDs, the second QDs, and/or the third QDs may be placed in one or more nanoporous structures as described above. In some embodiments, the third plurality of micro semiconductor devices does not include QDs.

A micro semiconductor device 620a, a micro semiconductor device 620b, and a micro semiconductor device 620c may form a pixel. As such, the micro semiconductor devices 620 correspond to a plurality of pixels. Each of the pixels may include a micro semiconductor device 620a emitting light of the first color, a micro semiconductor device 620b emitting light of the second color, and a micro semiconductor device 620c emitting light of the third color. As an example, the micro semiconductor device 620a may include the light-emitting device 570a and the nanoporous structure 563a as described in connection with FIGS. 5B-5E. The micro semiconductor device 620b may include the light-emitting device 570b and the nanoporous structure 563b as described in connection with FIGS. 5B-5E. The micro semiconductor device 620c may include the light-emitting device 570c and the nanoporous structure 563c as described in connection with FIGS. 5B-5E.

Figure 7:
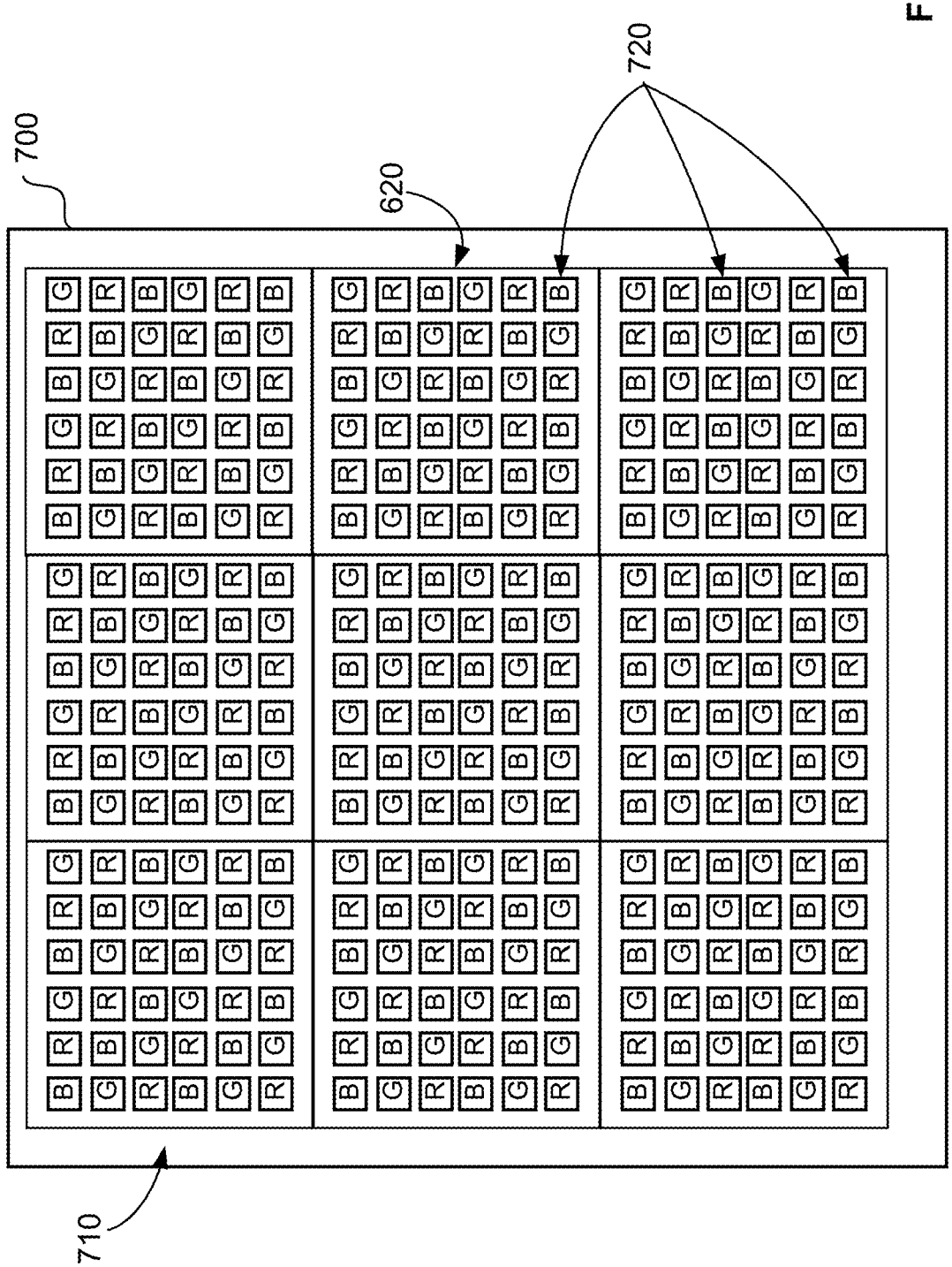
FIG. 7 depicts a schematic diagram illustrating an example of a display device in accordance with some embodiments of the present disclosure.

FIG. 7 depicts a schematic diagram illustrating an example 700 of a display device in accordance with some embodiments of the present disclosure. The display device 700 may be incorporated into any suitable computing device, such as mobile phones, laptops, desktops, tablet computer devices, wearable computing devices (e.g., watches, eyeglasses, head-mounted displays, virtual reality headsets, activity trackers, clothing, etc.), televisions, etc. The display device 700 may include one or more light-conversion devices as described herein. The display device may be of any suitable size.

As illustrated, display device 700 may include a substrate 710. The substrate 710 may include any suitable component for supporting micro semiconductor devices and/or any other suitable component of display device 700. In one implementation, substrate 710 may comprise a driver circuit (e.g., one or more CMOS drivers, a TFT, etc.). In another implementation, the second substrate does not comprise a driver circuit. Substrate 710 may include a plurality of conductive lines (e.g., rows and/or columns of conductive lines) connecting one or more of the micro semiconductor devices disposed on the substrate 710.

Display device 700 may include micro semiconductor devices 720 formed on substrate 710. Micro semiconductor devices 720 may include micro semiconductor devices 620 as described in connection with FIG. 6 above. For example, micro semiconductor devices 620 may be transferred from substrate 610 to substrate 710 to form display device 700. Transferring the micro semiconductor devices may include separating the micro semiconductor devices and the first substrate (e.g., by picking up the micro semiconductor devices using an array of electrostatic transfer heads, irradiating the plurality of micro semiconductor devices using a laser beam, etc.). The micro semiconductor devices may then be formed on substrate 710. As described above, the micro semiconductor devices 620 may form pixels of red micro semiconductor devices, green micro semiconductor devices, and blue micro semiconductors on the first substrate. The pixels may correspond to pixels of display device 700. As such, the micro semiconductor devices 620 do not have to be singulated or sorted to be transferred onto substrate 710. In some embodiments, the micro semiconductor devices and the driver circuit may be transferred from substrate 610 to substrate 710 together. In some embodiments, the mass transfer of micro semiconductor devices may be carried out in an iterative manner to form display device 700. For example, multiple sets of micro semiconductor devices 620 may be fabricated on multiple substrates 610 as described above and may then be transferred to display substrates of the display in parallel, sequentially, or in any other suitable manner.

While the semiconductor devices 620 are arranged in FIGS. 6 and 7 in certain manners, this is merely illustrative. The semiconductor devices 620 may be arranged in any suitable manner to form pixels of a display device. For example, two semiconductor devices 620b may be positioned between a semiconductor device 620a and a semiconductor device 620c in some embodiments. As another example, semiconductor devices located in different rows of the semiconductor devices 620 (e.g., a semiconductor device 620a in a first row and semiconductor devices 620b and 620c in a second row of the semiconductor devices 620) may form red, green, and blue pixels of the display device.

Referring to FIG. 8, example structures and processes of fabricating a light-conversion device in accordance with some embodiments of the present disclosure are illustrated. As shown, a solid material 820 may be provided on a growth template 810 (e.g., on a surface 811 of the growth template 810). Examples of the solid material may include semiconductor materials (Si, GaN, AlN, InGaN, AlGaN, etc.), glass, plastic, metal, polymer, etc. In some embodiments, the solid material 820 may include GaN. In some embodiments, the solid material 820 may include one or more epitaxial layers of a suitable semiconductor material, such as one or more layers of the semiconductor material not doped with an impurity, one or more layers of the semiconductor doped with a certain impurity. For example, the solid material 820 may include one or more layers of undoped GaN. As another example, the solid material 820 may include GaN or any other suitable material doped with a particular conductive type impurity, such as a layer of n-doped GaN. As a more particular example, the solid material 820 may include a first undoped GaN layer, one or more n-doped GaN layers grown on the first undoped GaN layer, and a second undoped GaN layer.

The growth template 810 may include any suitable material for forming the solid material 820. For example, the solid material 820 may include GaN. The growth template 810 may include sapphire, silicon carbide (SiC), silicon (Si), quartz, gallium arsenide (GaAs), aluminum nitride (AlN), and/or any other suitable material for growing GaN.

In some embodiments, the growth template 810 may include one or more electronically conductive materials (also referred to as the "conductive materials"). For example, the growth template 810 may include one or more semiconductor materials, such as silicon, SiC, AlN, etc. As another example, the semiconductor materials may include metals.

The solid material 820 may be processed to form a nanoporous structure using one or more electrochemical (EC) etching processes. For example, the solid material 820 may be etched to form a nanoporous structure comprising nanoporous materials (e.g., the porous structure 120 as described above). QDs may then be placed in the nanoporous structure. During the EC etching processes, the conductive growth template 810 may be etched as well. This may affect the formation of the nanoporous structure. To protect the growth template 810 from being etched during the EC etching processes, a protection layer 830 may be formed on one or more portions of the growth template 810. The protection layer 830 may prevent etchants from contacting the growth template during the etching processes. As an example, as illustrated in FIG. 8, a semiconductor device 800 may include the protection layer 830 that cover surfaces 813, 815, and/or 817 of the growth template 810. The surfaces 813 and 811 may represent opposite sides of the growth template 810. The surfaces 815 and 817 may correspond to side surfaces of the growth template 810. In one implementation, as illustrated in FIG. 8, the protection layer 830 covers one or more portions of the solid material 820. In another implementation, the protection layer 830 does not cover the solid material 820.

Forming the protection layer 830 on the growth template 810 may include depositing one or more suitable materials that may prevent the etchant from contacting the growth template and/or prevent the growth template 810 from being etched during the etching processes, such as epoxy, glue, wax, etc.

In some embodiments, the protection layer 830 may be removed after finishing the EC etching process. For example, the protection layer may be removed using chemical methods (e.g., by cleaning the semiconductor device 800 in acetone or any other suitable chemical). As another example, the protection layer may be removed by heating the protection layer 820 and/or the semiconductor device 800.

Figure 9:
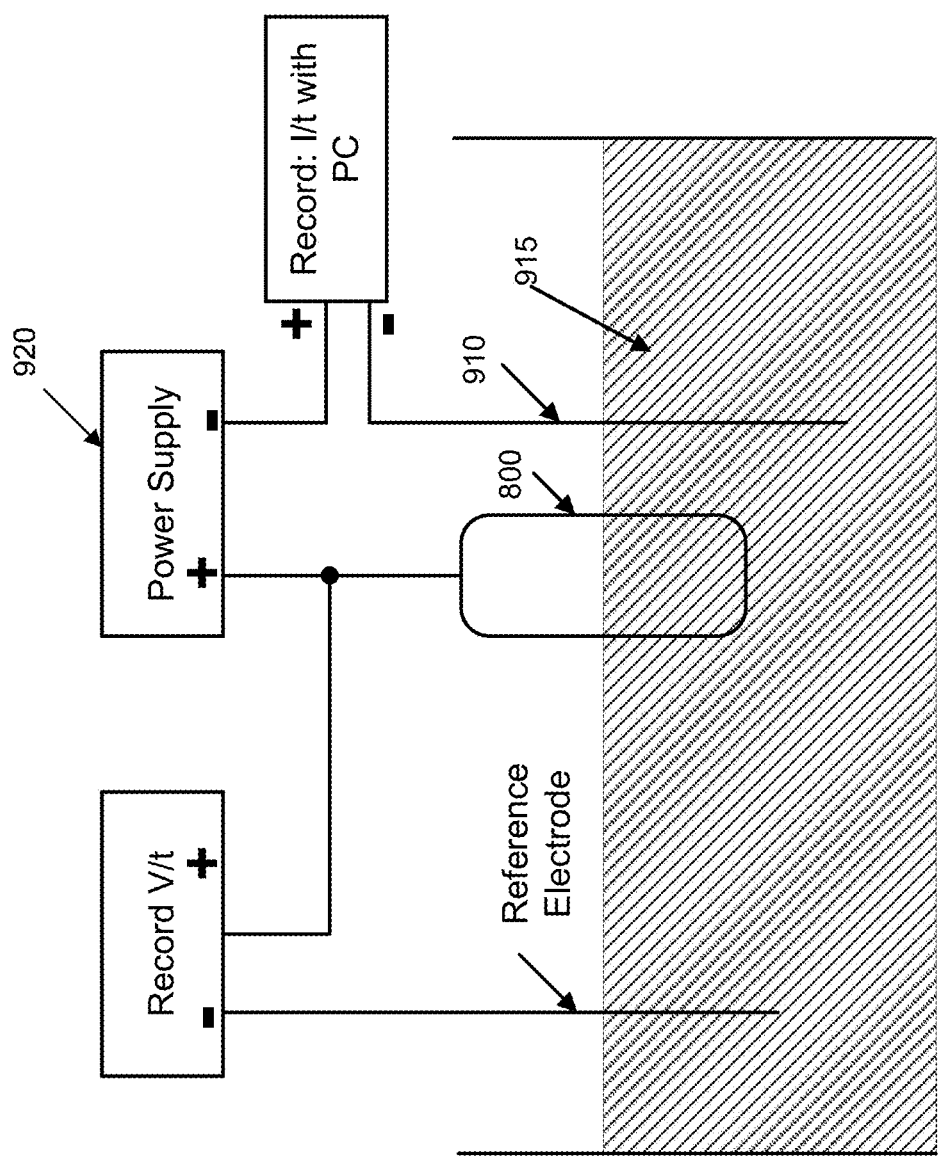
FIG. 9 is a flowchart illustrating an example process for forming a porous structure in accordance with some embodiments of the present disclosure.

Referring to FIG. 9, an example process for forming a porous structure in accordance with some embodiments of the present disclosure is illustrated. As shown, the semiconductor device 800 may be exposed to an electrolyte 905 (e.g., oxalic acid, KOH, HCL, etc.). An electrode 910 may be immersed in the electrolyte. The semiconductor device 800 and the electrode 910 may be coupled to a first terminal and a second terminal of a power supply 920, respectively, to form a circuit. The power supply may energize the circuit to electrochemically etch the solid material 820 to form a porous structure as described in connection with FIGS. 1A-1D. For example, a plurality of pores may be electrochemically etched in one or more portions of the solid material 820 (e.g., an n-type doped GaN layer). Each of the pores may have a nanoscale size (e.g., a size of the order of 1 nm to 1000 nm or larger). To form the pores, a mask (not shown) may be formed on one or more portions of the solid material 820 prior to the etching process. The mask may include one or more materials that are not electrically conductive. As such, the portions of the solid material 820 covered by the mask are not etched during the etching process, while the portions of the solid materials 820 that are not covered by the mask may be etched during the etching process. The dimensions and/or the pattern of the mask may be adjusted to facilitate the formation of pores at desired positions and/or of suitable dimensions. A particular porosity and/or other property of the nanoporous structure may be achieved by controlling the voltage and/or current provided by the power supply and/or by controlling the doping concentration of the n-doped GaN. During the EC etching process, the protection layer 830 may protect the growth template 810 from contacting the electrolyte and may thus prevent the growth template 810 from being etched.

Figure 10:
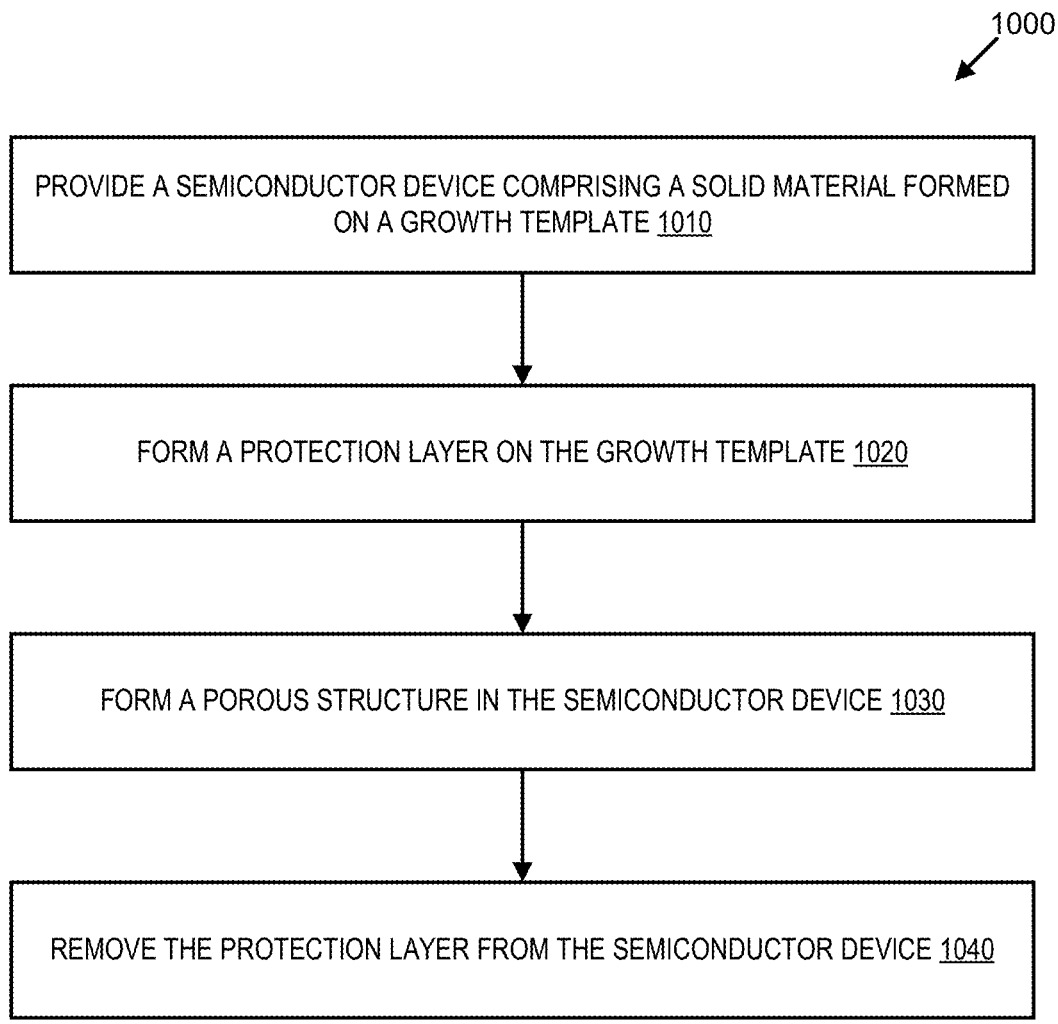
FIG. 10 is a flowchart illustrating an example of a process for forming a nanoporous structure in accordance with one or more aspects of the present disclosure.

Referring to FIG. 10, an example 1000 of a process for forming a porous structure in accordance with some embodiments of the present disclosure is provided.

At block 1010, a semiconductor device comprising a solid material formed on a growth template may be provided. The growth template may include one or more conductive materials, such as silicon, metals, etc. In some embodiments, providing the semiconductor device may include growing one or more layers of semiconductor materials, such as a layer of a given semiconductor material, a layer of the semiconductor material with a particular conductive type impurity (e.g., an n-doped layer of the semiconductor material). The semiconductor materials may include, for example, a group III-V material. As an example, one or more undoped GaN layers may be grown on the growth template. As another example, one or more n-doped GaN layers may be grown on the growth template. In some embodiments, providing the solid material on the growth template may include growing an undoped GaN layer on the growth template and growing one or more n-doped GaN layers on the undoped GaN layer. In some embodiments, the growth template does not include a foreign substrate.

At block 1020, a protection layer may be formed on the growth template. The protection layer may protect the growth template from being etched in an EC process. In some embodiments, forming the protection layer may include depositing, on one or more surfaces of the growth template, a suitable material that may protect the growth template from being etched in an EC process. Examples of the material may include epoxy, etc.

At 1030, a porous structure may be formed in the semiconductor device. The porous structure may include nanoporous materials (e.g., the nanoporous structure as described in connection with FIGS. 1a-1c above). To form the porous structure in the semiconductor device, the semiconductor device and/or the solid material may be processed using an EC etching process in some embodiments. For example, the semiconductor device comprising the growth template and the solid material may be exposed to an electrolyte and may be processed as described in connection with FIG. 9 above. Processing the semiconductor device using the EC etching process may form a plurality of pores in one or more portions of the solid material (e.g., one or more layers of n-doped GaN or any other suitable material). Each of the pores may be of a nanoscale size (e.g., a size of the order of 1 nm to 1000 nm or larger). The solid material may be processed and/or the nanoporous structure may be formed after the formation of the protection layer for the growth template.

At block 1040, the protection layer may be removed from the semiconductor device. For example, the epoxy of the protection layer may be removed by cleaning the semiconductor device in acetone. The protection layer may be removed after the processing of the semiconductor device and/or the formation of the porous structure.

Figure 11:
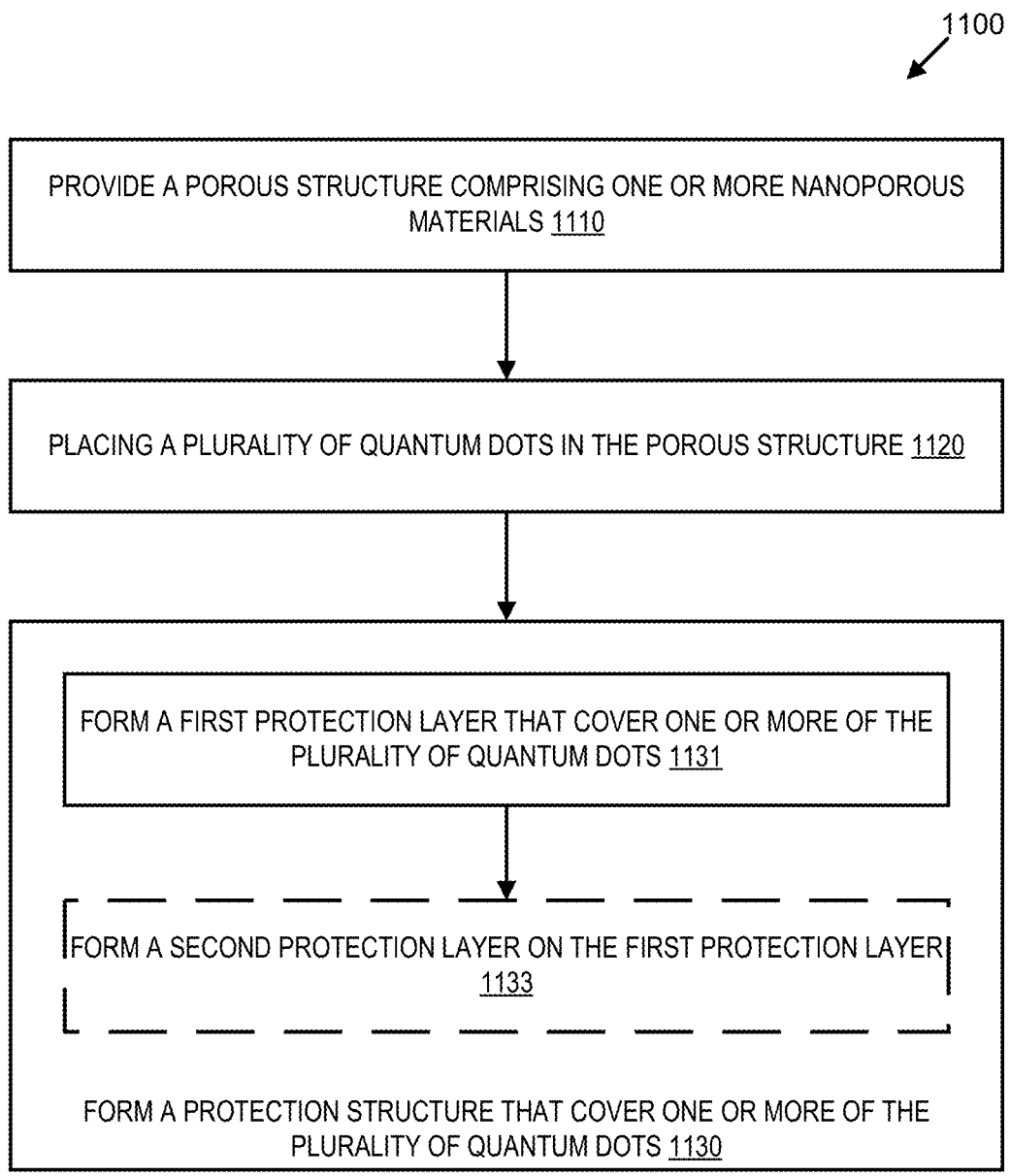
FIG. 11 is a flowchart illustrating an example of a process for forming a forming a light-conversion device in accordance with one or more aspects of the present disclosure.

Referring to FIG. 11, an example 1100 of a method for forming a light-conversion device in accordance with some embodiments of the present disclosure is provided. The light-conversion device may be and/or include the light-conversion devices 130 and/or 150 as described in connection with FIGS. 1A-1D.

At block 1110, a porous structure comprising one or more nanoporous materials may be provided. The one or more nanoporous materials may include a matrix structure and a plurality of pores. Each of the pores may have a nanoscale size.

In some embodiments, providing the porous structure may include fabricating the porous structure. For example, one or more operations as described in connection with FIGS. 1A-1B above may be performed. In some embodiments, fabricating the porous structure may include forming the one or more nanoporous material using a solid material, such as a semiconductor material, glass, plastic, metal, polymer, etc. For example, the solid material may be etched to form pores of nanoscale sizes in the solid material.

At block 1120, a plurality of quantum dots may be placed in the porous structure. The quantum dots may have various emission wavelengths and may convert light incident on the quantum dots into light of mixed color emissions. For example, the quantum dots may convert light of a first color into light of a second color and light of a third color. As another example, the quantum dots may also convert the light of the first color into light of a fourth color. In some embodiments, the second color, the third color, and the fourth color may include a green color, a red color, and a blue color, respectively. In some embodiments, the input light may include violet light. The quantum dots may be placed in the porous structure using a photolithography method, an inkjet printing method, etc.

In some embodiments, the quantum dots may be placed in the porous structure using a dispensing machine. For example, the dispensing machine may dispense liquids and/or fluids containing the QDs on a surface of the porous structure. The liquids and/or fluids may then infiltrate into the porous structure. The QDs in the liquids and/or fluids may be placed into the porous structure (the pores of the porous structure). In some embodiments, the dispensing machine may atomize the liquids and/or the fluids containing the QDs and spray the liquid and/or the fluids on the surface of the porous structure. Dispensing the liquid on the porous structure may involve dispensing a suitable volume of the liquid on one or more portions of the surface of the porous structure (e.g., at the center of the porous structure) and spinning the porous structure. The porous structure may be placed in an $N_2$ environment while the QDs are loaded into the porous structure.

In some embodiments, placing the quantum dots in the porous structure may include placing a first plurality of quantum dots into a first portion of the porous structure (e.g., a first plurality of pores in the nanoporous materials). The first plurality of quantum dots may have a first emission wavelength and may convert input light of a first color into light of a second color. The light of the second color may have a wavelength corresponding to the first emission wavelength.

Placing the quantum dots in the porous structure may further include placing a second plurality of quantum dots into a second portion of the porous structure (e.g., a second plurality of pores in the nanoporous materials). The second plurality of quantum dots may have a second emission wavelength and may convert the input light into light of a third color. The light of the third color may have a wavelength corresponding to the second emission wavelength. In some embodiments, the first plurality of quantum dots and the second plurality of quantum dots may be placed into the porous structure via a first channel and a second channel of the dispensing machine, respectively. For example, the first channel of the dispensing machine may dispense a first liquid containing the first plurality of quantum dots on the first portion of the nanoporous structure (e.g., a first nanoporous structure including a first plurality of nanopores). The second channel of the dispensing machine may dispense a second liquid containing the second plurality of quantum dots on the second portion of the nanoporous structure (a second nanoporous structure including a second plurality of nanopores). The first portion and the second portion of the porous structure do not overlap with each other.

In some embodiments, placing the quantum dots in the porous structure may further include placing a third plurality of quantum dots into a third portion of the porous structure (e.g., a third plurality of pores in the nanoporous materials). The third plurality of quantum dots may have a third emission wavelength and may convert the input light into light of a fourth color. The light of the fourth color may have a wavelength corresponding to the third emission wavelength.

Loading the quantum dots into the porous structure using the dispensing machine described herein may increase the concentration of the quantum dots placed in the porous structure, further enhancing color purity of the light produced by the light conversion device. In some embodiments, the color purity of the light of the second color, the light of the third color, and/or the light of the fourth color may be about or higher than 99%. In some embodiments, the color purity of the light of the second color, the light of the third color, and/or the light of the fourth color may be about or higher than 99.9%.

At block 1130, a protection structure may be formed. The protection structure may cover the plurality of quantum dots placed in the nanoporous structure. In some embodiments, the quantum dots are configured to convert light with a first emission wavelength to light with a second emission wavelength and light with a third emission wavelength. The protection structure may be and/or include the protection structure 155 of FIG. 1D.

In some embodiments, forming the protection structure may include forming one or more layers of materials that may prevent the QDs from oxidation, moisture, and/or other environmental factors. For example, forming the protection structure may include forming a first protection layer covering surfaces of the quantum dots placed in the porous structure at block 1131. The first protection layer may include a first material, such as PDMS, PMMA, epoxy, etc. In some embodiments, forming the first protection layer may include coating the QDs in the nanoporous materials with the first material.

Coating the QDs may include spinning coating the nanoporous structure. The first material may be and/or include a liquid that may flow in the nanoporous structure and/or the nanoporous materials and may cover the surfaces of the QDs placed in the nanoporous structure.

Forming the protection structure may include forming a second protection layer on the first protection layer at block 1133. The second protection layer may include a second material, such as $SiO_2$, SiN, $Al_2O_3$, etc. The second material may be different from the first material in some embodiments. Forming the second protection layer may include depositing a layer of the second material (e.g., a $SiO_2$ film, a SiN film, an $Al_2O_3$ film, etc.) on the first protection layer.

Figure 12:
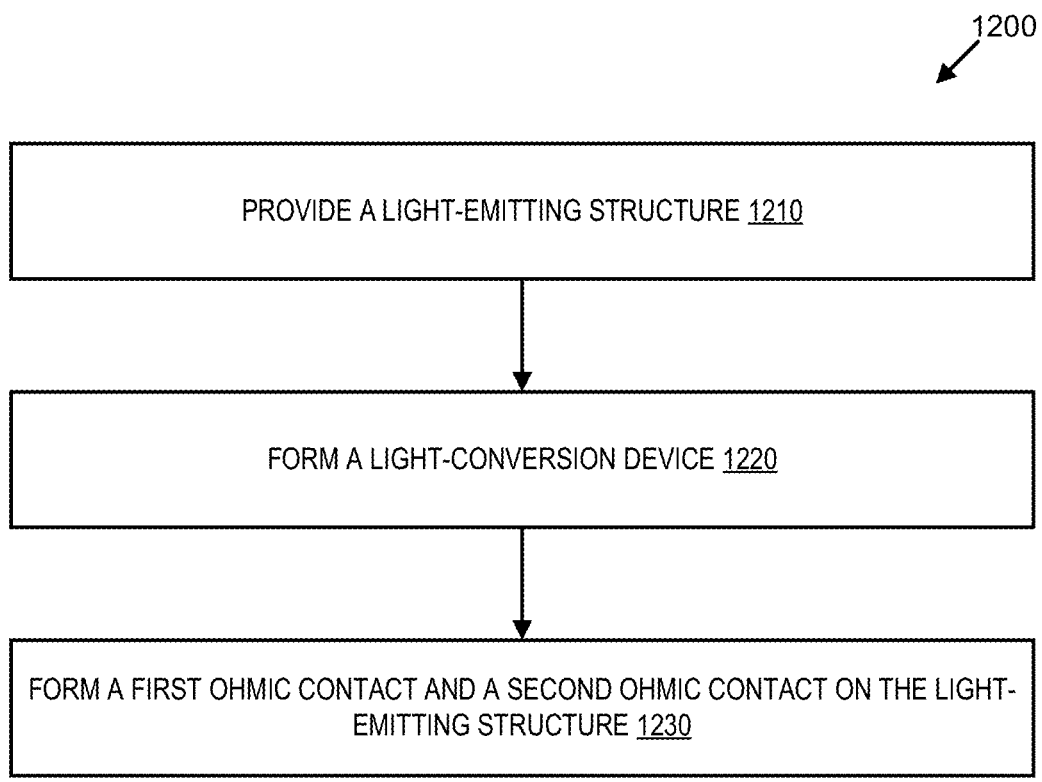
FIG. 12 is a flowchart illustrating an example of a process for forming a forming a light-emitting device in accordance with one or more aspects of the present disclosure.

Referring to FIG. 12, an example 1200 of a method for forming a light-emitting device in accordance with some embodiments of the present disclosure is provided. The light-emitting device may be and/or include a semiconductor device as described in connection with FIGS. 3A-3E.

At block 1210, a light-emitting structure may be provided. The light-emitting structure may include one or more epitaxial layers of group III-V materials and/or any other suitable material. As an example, the light-emitting structure may include a first semiconductor layer comprising an n-doped GaN layer, a second semiconductor layer comprising an active layer, a third semiconductor layer comprising a p-doped GaN layer, etc. In some embodiments, forming the light-emitting structure may include forming the first semiconductor layer, the second semiconductor layer, the third semiconductor layer, etc. on a growth template (e.g., a sapphire substrate, a GaN substrate, etc.). The light-emitting structure may be and/or include the light-emitting structure 310 of FIG. 3.

In some embodiments, the light-emitting structure may be formed on a driving circuit. The driving circuit may include one or more electrical circuits (e.g., an array of electrical circuits) that may be individually controllable. In some embodiments, the driving circuit may include one or more complementary metal-oxide-semiconductor (CMOS) drivers.

At block 1220, a light-conversion device may be formed. The light-conversion device may include a plurality of quantum dots placed in a porous structure comprising one or more nanoporous materials (e.g., a light-conversion device as described in connection with FIGS. 1A-2B above). In some embodiments, the light-conversion device may be formed on the first semiconductor layer. For example, the growth template may be removed from the light-emitting structure (e.g., using a laser lift-off or any other suitable technique) to expose the first semiconductor layer. The light-conversion device may then be formed on the first semiconductor layer (e.g., by forming one or more porous structures comprising nanoporous materials ("nanoporous structures") and placing QDs in the nanoporous structure(s)). As an example, forming the nanoporous structures may include etching one or more portions of the first semiconductor layer. As another example, forming the nanoporous structures may include fabricating a solid material into nanoporous materials (e.g., a semiconductor material, glass, plastic, metal, polymer, etc.). As described above, the nanoporous structure(s) may or may not be in direct contact with the first semiconductor layer.

In some embodiments, the light-conversion device may be formed on the growth template and/or the light-emitting structure. For example, one or more epitaxial layers of GaN may be grown on the growth template. A nanoporous structure may then be formed by etching the epitaxial layer of GaN. As another example, forming the nanoporous structures may include fabricating a solid material into nanoporous materials (e.g., a semiconductor material, glass, plastic, metal, polymer, etc.). The nanoporous structure may or may not be in direct contact with the growth template.

At block 1230, a first ohmic contact (e.g., an n-pad) and a second ohmic contact (e.g., a p-pad) may be formed on the light-emitting structure. In one implementation, the first ohmic contact and the second ohmic contact may be deposited on the same side of the light-emitting structure. In such implementation, the light-conversion device and the first ohmic contact may be deposited on opposite sides of the light-emitting structure. In another implementation, the first ohmic contact and the second ohmic contact may be deposited on opposite sides of the light-emitting structure. In such implementation, the first ohmic contact and the light-conversion device may be deposited on the same side of the light-emitting structure.

Figure 13:
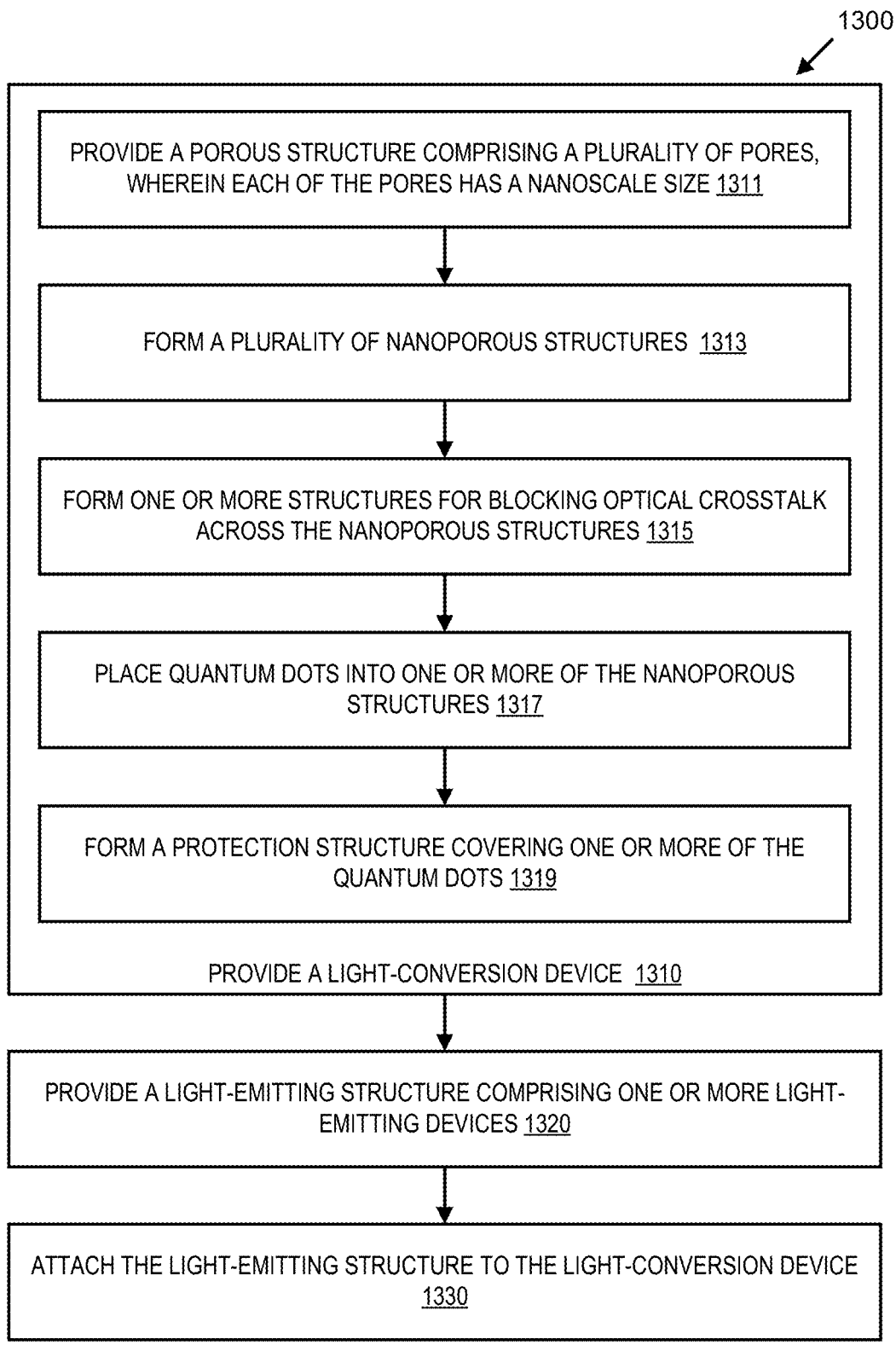
FIG. 13 is a flowchart illustrating an example of a process for forming a forming a semiconductor device including a plurality of light-emitting devices in accordance with one or more aspects of the present disclosure.

Referring to FIG. 13, an example 1300 of a method for fabricating a semiconductor device including a plurality of light-emitting devices in accordance with some embodiments of the present disclosure is provided.

At block 1310, a light-conversion device may be provided. The light conversion device may include one or more porous structures with embedded quantum dots. The light-conversion device may include light-conversion device 130 and/or 150 as described in connection with FIGS. 1C-1D above. In some embodiments, a first portion of the light-conversion device may include a first nanoporous structure embedded with first quantum dots that can convert light passing through the first nanoporous structure into light of a first color. A second portion of the light-conversion device may include a second nanoporous structure embedded with second quantum dots that can convert light passing through the second nanoporous structure into light of a second color. A third portion of the light-conversion device may include a third nanoporous structure. In one implementation, the third nanoporous structure does not include quantum dots. In another implementation, the third nanoporous structure includes quantum dots that can convert light passing through the third nanoporous structure into light of a third color. In some embodiments, the first color, the second color, and the third color may be a red color, a green color, and a blue color, respectively. The first nanoporous structure, the second nanoporous structure, and the third nanoporous structure do not overlap with each other.

In some embodiments, providing the light-conversion device may include performing one or more operations as depicted in blocks 1311-1319.

At block 1311, a porous structure comprising a plurality of pores may be provided. Each of the pores may have a nanoscale size. The porous structure may be and/or include, for example, a porous structure 120 as described in connection with FIG. 1B. In some embodiments, providing the porous structure may include fabricating the porous structure using a solid material as described in connection with block 1110 of FIG. 11.

At block 1313, a plurality of nanoporous structures may be formed. Each of the nanoporous structures may correspond to a portion of the light-conversion device. For example, the nanoporous structures may be formed by forming one or more trenches or any other suitable structures that may divide the porous structure into a plurality of portions. Two adjacent nanoporous structures may be separated by one of the trenches. The trenches may be formed, for example, by etching the porous structure. The positions and/or dimensions of the trenches may correspond to the positions and/or dimensions of light-emitting devices to be attached to the light-conversion device.

At block 1315, one or more structures for blocking optical crosstalk across the nanoporous structures may be formed. For example, one or more sidewalls of the trenches may be coated with a metallic material. The metallic material may include, for example, aluminum, nickel, and/or any other suitable metal. The metallic material may be coated using an electro-beam lithography technique or any other suitable technique.

At block 1317, quantum dots may be placed in one or more of the nanoporous structures. For example, the first quantum dots and the second quantum dots may be placed in the first nanoporous structure and the second nanoporous structure, respectively. In some embodiments, the quantum dots may be placed using a photolithography method, an inkjet printing method, etc. In some embodiments, the first quantum dots and the second quantum dots may be placed in the nanoporous structures using a dispensing machine. For example, the dispensing machine may dispense a first liquid containing the first quantum dots on a surface of the first nanoporous structure to place the first quantum dots in the first nanoporous structure. The dispensing machine may dispense a second liquid containing the second quantum dots on a surface of the second nanoporous structure to place the second quantum dots in the second nanoporous structure. In some embodiments, the first quantum dots may be placed in the first nanoporous structure using a first channel of the dispensing machine. The second quantum dots may be placed in the second nanoporous structure using a second channel of the dispensing machine. The first quantum dots and the second quantum dots may be placed in the nanoporous structures in any suitable sequential order (e.g., sequentially, simultaneously, substantially simultaneously, etc.).

At block 1319, a protection structure covering one or more of the quantum dots may be formed. The protection structure may be and/or include the protection structure 155 of FIG. 1D. In some embodiments, the protection structure may be formed by performing one or more operations described in connection with block 1130 of FIG. 11 above.

At block 1320, a light-emitting structure comprising one or more light-emitting devices may be provided. In some embodiments, the light-emitting structure may include a plurality of light-emitting devices capable of producing light (e.g., a first light-emitting device, a second light-emitting device, a third light-emitting device, etc.). Each of the light-emitting devices may include a first ohmic contact and a second ohmic contact. One or more of the light-emitting devices may be and/or include a light-emitting diode in some embodiments. In some embodiments, one or more of the light-emitting devices may include a flip-chip structure LED as described herein.

A light-emitting device in the light-emitting structure may correspond to a nonporous structure in the light-conversion device. For example, the first light-emitting device, the second light-emitting device, and the third light-emitting device may correspond to the first nanoporous structure, the second nanoporous structure, and the third nanoporous structure, respectively. The light produced by the first light-emitting device may pass through the first nanoporous structure and may be converted into light of the first color by the first quantum dots placed in the first nanoporous structure. The light produced by the second light-emitting device may pass through the second nanoporous structure and may be converted into light of the second color by the second quantum dots placed in the second nanoporous structure. The light produced by the third light-emitting device may pass through the third nanoporous structure. In some embodiments, the third nanoporous structure does not include quantum dots.

At block 1330, the light-emitting structure may be attached to the light-conversion device. Attaching the light-emitting device to the light-conversion device may include mounting the light-emitting structure on a substrate of the light-emitting structure. The light-emitting device may be attached to the light-conversion device using one or more flip-chip assembly techniques.

Figure 14:
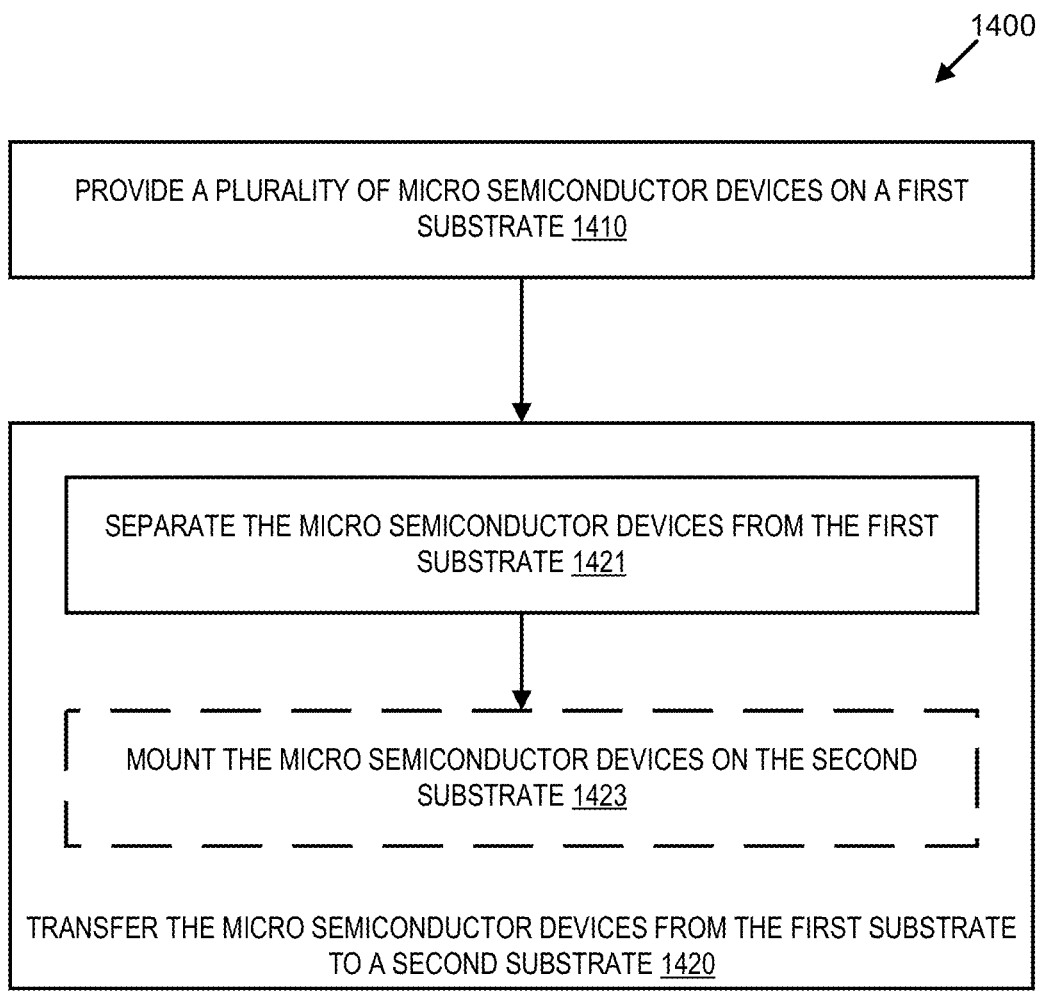
FIG. 14 is a flowchart illustrating an example of a process for fabricating a display device in accordance with one or more aspects of the present disclosure.

Referring to FIG. 14, an example 1400 of a method for fabricating a display device in accordance with some embodiments of the present disclosure is provided.

At block 1410, a plurality of micro semiconductor devices may be provided on a first substrate. For example, the semiconductor devices 620 of FIG. 6 may be provided on the substrate 610 of FIG. 6. In some embodiments, the first substrate may be and/or include a growth substrate for growing GaN and/or any other material of the light-emitting structure. For example, the first substrate may include sapphire, SiC, Si, quartz, GaAs, aluminum nitride (AlN), GaN, etc. In some embodiments, the first substrate may include a silicon wafer comprising CMOS drivers.

The plurality of micro semiconductor devices may emit light of varying colors (e.g., red, green, blue, etc.). For example, a first plurality of the micro semiconductor devices may emit light of a first color (e.g., micro semiconductor devices 620a of FIG. 6). A second plurality of the micro semiconductor devices may emit light of a second color (e.g., micro semiconductor devices 620b of FIG. 6). A third plurality of the micro semiconductor devices may emit light of a third color (e.g., micro semiconductor devices 620c of FIG. 6). In some embodiments, the first color, the second color, and the third color may be a red color, a green color, and a blue color, respectively.

One or more of the micro semiconductor devices may include a light-conversion device as described herein. For example, the first plurality of micro semiconductor devices may include first QDs with a first emission wavelength (QDs that can convert input light to red light). The second plurality of micro semiconductor devices may include second QDs with a second emission wavelength (QDs that can convert input light to green light). The third plurality of micro semiconductor devices may include third QDs with a third emission wavelength (QDs that can convert input light to blue light). The first QDs, the second QDs, and/or the third QDs may be placed in one or more nanoporous structures as described above. In some embodiments, the third plurality of micro semiconductor devices do not include QDs.

In some embodiments, the micro semiconductor devices may be provided on a driving circuit. For example, the micro semiconductor devices may be mounted on the driving circuit. In some embodiments, the micro semiconductor devices may be mounted to the driving circuit through a metal bonding process (e.g., indium metal bonding). In some embodiments, to provide the micro semiconductor devices on the driving circuit, a wafer comprising the micro semiconductor devices may be mounted to a wafer comprising the driving circuit (e.g., a Si CMOS driver wafer).

At block 1420, the plurality of micro semiconductor devices may be transferred from the first substrate to a second substrate. In some embodiments, the second substrate may be part of a display module of a display. In one implementation, the second substrate may comprise a driver circuit (e.g., one or more CMOS drivers, a TFT, etc.). In another implementation, the second substrate does not comprise a driver circuit. The second substrate may comprise a plurality of conductive lines (e.g., rows and/or columns of conductive lines). As an example, the second substrate may be and/or include a substrate 710 of FIG. 7.

In some embodiments, transferring the micro semiconductor devices from the first substrate to the second substrate may include selectively transferring the plurality of micro semiconductor devices from the first substrate to the second substrate. For example, one or more of the micro semiconductor devices may be tested and/or selected prior to being transferred to the second substrate. The tests and/or selection may be made based on a specification defining one or more features of one or more micro semiconductor devices that are to be transferred to the second substrate. Examples of the features may include a predetermined emission wavelength of a micro semiconductor device, a predetermined output current of a micro semiconductor device, a predetermined percentage of micro semiconductor devices that satisfy the specification, etc.

Transferring the micro semiconductor devices may include separating the micro semiconductor devices and the first substrate at block 1421 (e.g., by picking up the micro semiconductor devices using an array of electrostatic transfer heads, irradiating the plurality of micro semiconductor devices using a laser beam, etc.). The micro semiconductor devices may then be mounted on the second substrate at block 1423.

Process 1400 may be carried out in an iterative manner to fabricate the display. For example, micro semiconductor devices may be fabricated on multiple substrates 610 as described above and may then be transferred to display substrates of the display in parallel, sequentially, or in any other suitable manner.

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices.

Figure 15:
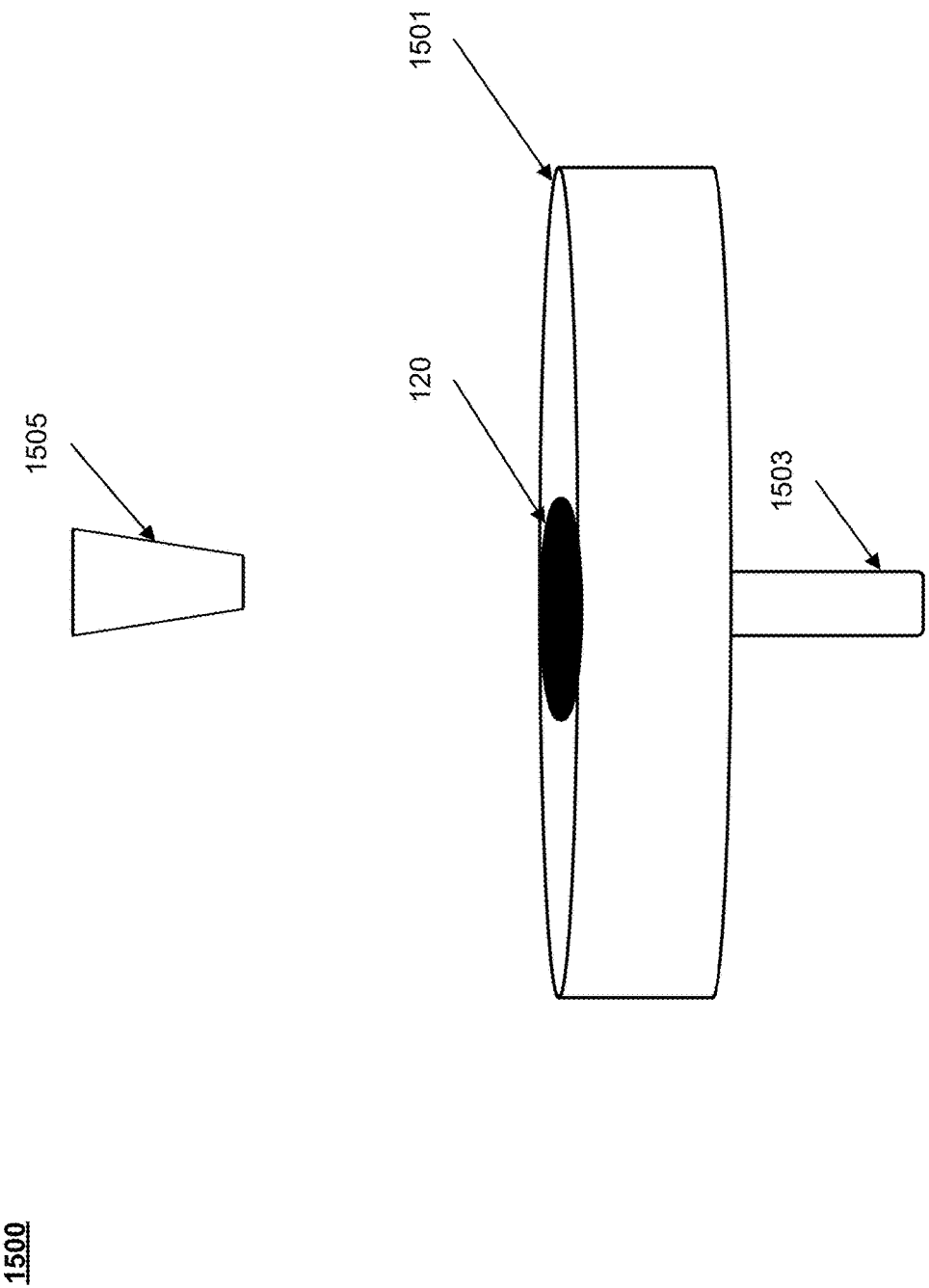
FIG. 15 is a diagram illustrating components of an example dispensing machine in accordance with some embodiments of the present disclosure.

Referring to FIG. 15, a dispensing machine 1500 for placing quantum dots into nanoporous structures is shown. As illustrated, dispensing machine 1500 may include a supporting structure 1501 that may hold a porous structure 120 by vacuum and/or any other suitable mechanism that may hold the porous structure 120 for placement of QDs. In some embodiments, the supporting structure 1501 may include a chuck 1503 that may spin the porous structure 120. Dispensing machine 1500 may further include one or more dispensing nozzles 1505 that may dispense a liquid containing quantum dots (the "QD solution") onto the porous structure 120. In some embodiments, the dispensing nozzle(s) 1505 may atomize the QD solutions and spray the QD solution onto the surface of the porous structure 120. In some embodiments, the dispensing nozzle(s) 1505 may dispense a suitable volume of the QD solution on one or more portions of the surface of the porous structure 120 (e.g., at the center of the porous structure 120). In some embodiments, the chuck 1503 may spin the porous structure 120 to facilitate the placement of the QDs in the nanoporous materials and/or the pores in the porous structure 120. The dispensing machine 1500 may create an $N_2$ environment while the QDs are loaded into the porous structure 120. The supporting structure, the dispensing nozzles 1505, and/or any other component of the dispensing machine 1500 may be enclosed in a housing (not shown). Dispensing machine 1500 may include a processor (not shown) that may control the dispensing of the QD solution using software.

In some embodiments, dispensing machine 1500 may include a plurality of channels (not shown). Each of the channels may include one or more dispensing nozzles as described herein. Multiple channels of the dispensing machine 1500 may dispense QD solutions containing different QDs. For example, a first channel of the dispensing machine 1500 may dispense first QD solutions containing the first quantum dots as described herein. A second channel of the dispensing machine 1500 may dispense second QD solutions containing the second quantum dots as described herein. A third channel of the dispensing machine 1500 may dispense third QD solutions containing the third quantum dots as described here. The first QD solutions, the second QD solutions, and/or the third QD solutions may be dispensed on various portions of the porous structure to place the first quantum dots, the second quantum dots, and the third quantum dots into the first portion, the second portion, and the third portion of the porous structure, respectively. The first QD solutions, the second QD solutions, and/or the third QD solutions may be dispensed in any suitable sequential order.

FIG. 16 is a graph showing EL intensity versus wavelength for an example semiconductor device in accordance with some embodiments of the present disclosure. As shown, the color purity of a semiconductor device as described herein may be about or greater than 99%.

The following examples illustrate various implementations in accordance with one or more aspects of the present disclosure.

Example 1 is a semiconductor device, comprising: a porous structure formed on a light-emitting structure, wherein the porous structure comprises one or more nanoporous materials; a plurality of quantum dots placed in the porous structure; a first ohmic contact; and a second ohmic contact.

Example 2 includes the semiconductor device of example 1, wherein the second ohmic contact and the porous structure are disposed on opposite sides of the light-emitting structure.

Example 3 includes the semiconductor device of example 1, wherein the first ohmic contact and the porous structure are formed on the same side of the light-emitting structure.

Example 4 includes the semiconductor device of example 1, wherein the first ohmic contact and the porous structure are disposed on opposite sides of the light-emitting structure.

Example 5 includes the semiconductor device of example 1, wherein the porous structure is not in direct contact with the light-emitting structure.

Example 6 includes the semiconductor device of example 5, wherein the semiconductor device further comprises a support layer positioned between the light-emitting structure and the porous structure, wherein the support layer comprises $Al_2O_3$.

Example 7 includes the semiconductor device of example 5, wherein the porous structure and the light-emitting structure is separated by a space.

Example 8 includes the semiconductor device of example 1, wherein a sidewall of the semiconductor device is coated with a reflective material.

Example 9 includes the semiconductor device of example 1, wherein the plurality of quantum dots comprises one or more first quantum dots with a first emission wavelength and one or more second quantum dots with a second emission wavelength.

Example 10 includes the semiconductor device of example 9, wherein the plurality of quantum dots further comprises one or more third quantum dots with a third emission wavelength.

Example 11 includes the semiconductor device of example 1, wherein the one or more nanoporous materials comprise at least one of a semiconductor material, glass, plastic, metal, or polymer.

Example 12 includes the semiconductor device of example 1, wherein the light-emitting structure comprises one or more epitaxial layers of GaN.

Example 13 is a method for fabricating a semiconductor device, comprising: forming, on a light-emitting structure, a light-conversion device that converts light produced by the light-emitting structure into light of a plurality of colors, wherein forming the light-conversion device comprises: forming, on the light-emitting structure, a porous structure comprising one or more nanoporous materials; and placing a plurality of quantum dots in the porous structure.

Example 14 includes the method of example 13, wherein the light-emitting structure comprises a growth template and a semiconductor layer comprising an n-doped GaN layer.

Example 15 includes the method of example 14, further comprising: removing the growth template of the light-emitting structure to expose the semiconductor layer of the light-emitting structure, wherein forming, on the light-emitting structure, the porous structure comprises etching at least a portion of the semiconductor layer.

Example 16 includes the method of example 15, wherein forming, on the light-emitting structure, the porous structure comprises forming the light-conversion device on the semiconductor layer.

Example 17 includes the method of example 14, further comprising: forming the porous structure on the growth template.

Example 18 includes the method of example 13, wherein placing the plurality of quantum dots in the porous structure comprises placing one or more first quantum dots with a first emission wavelength and one or more second quantum dots with a second emission wavelength.

Example 19 includes the method of example 18, wherein placing the plurality of quantum dots in the porous structure comprises placing one or more third quantum dots with a third emission wavelength.

Example 20 includes the method of example 13, wherein the plurality of quantum dots is placed in the porous structure using at least one of a photolithography method or an inkjet printing method.

Example 21 includes the method of example 13, wherein the porous structure is not in direct contact with the light-emitting structure.

Example 22 includes the method of example 21, wherein the porous structure and the light-emitting structure are separated by a space.

Example 23 includes the method of example 13, further comprising coating a sidewall of the semiconductor device with a reflective material.

Example 24 is a method comprising: forming a plurality of micro semiconductor devices on a first substrate, wherein the plurality of micro semiconductor devices comprises a first plurality of micro semiconductor devices for emitting light of a first color, a second plurality of micro semiconductor devices for emitting light of a second color, and a third plurality of micro semiconductor devices for emitting light of a third color; and transferring the plurality of micro semiconductor devices from the first substrate onto a second substrate.

Example 25 includes the method of example 24, wherein the first plurality of micro semiconductor devices comprises a first plurality of quantum dots placed in one or more first nanoporous structures.

Example 26 includes the method of example 25, wherein the second plurality of micro semiconductor devices comprises a second plurality of quantum dots placed in one or more second nanoporous structures.

Example 27 includes the method of example 26, wherein the third plurality of micro semiconductor devices comprises a third plurality of quantum dots placed in one or more third nanoporous structures.

Example 28 includes the method of example 24, wherein the second substrate comprises a display substrate, and wherein a first pixel of the first plurality of micro semiconductor devices, a second pixel of the second plurality of micro semiconductor devices, and a third pixel of the third plurality of micro semiconductor devices form a pixel of the display.

Example 29 includes the method of example 24, wherein the first color is red, wherein the second color is green, and wherein the third color is blue.

Example 30 includes the method of example 24, wherein forming the plurality of micro semiconductor devices on the first substrate comprises: forming the plurality of micro semiconductor devices on a driver circuit.

Example 31 includes the method of example 30, wherein the driver circuit comprises a complementary metal-oxide-semiconductor (CMOS) driver.

Example 32 includes the method of example 24, further comprising separating the plurality of micro semiconductor devices and the first substrate, Example 33 includes the method of example 32, wherein separating the plurality of micro semiconductor devices comprises picking up the plurality of semiconductor devices using an array of electrostatic transfer heads.

Example 34 includes the method of example 32, wherein separating the plurality of micro semiconductor devices comprises: irradiating the plurality of micro semiconductor devices using a laser beam.

Examples 35 is a display, comprising: a first plurality of micro semiconductor devices for emitting first light of a first color, a second plurality of micro semiconductor devices for emitting second light of a second color, and a third plurality of micro semiconductor devices for emitting third light of a third color, wherein the first plurality of micro semiconductor devices comprises a first plurality of quantum dots placed in one or more first nanoporous structures, and wherein the second plurality of micro semiconductor devices comprises a second plurality of quantum dots placed in one or more second nanoporous structures.

Example 36 includes the display of example 35, wherein the third plurality of micro semiconductor devices comprises a third plurality of quantum dots placed in one or more third nanoporous structures.

Example 37 is a semiconductor device, comprising: a porous structure formed on a light-emitting structure, wherein the porous structure comprises one or more nanoporous materials; a plurality of quantum dots placed in the porous structure; and scattering media positioned between the porous structure and the light-emitting structure.

Example 38 includes the semiconductor device of example 37, wherein the scattering media comprises at least one of $SiO_2$, SiN, polymers, or Xerogel.

Example 39 includes the semiconductor device of example 37, wherein the scattering media is configured to cause scattering of at least a portion of light produced by the light-emitting structure.

Example 40 includes the semiconductor device of example 38, wherein the scattering media is formed on a first surface of the light-emitting structure, wherein the porous structure is formed on a second surface of the scattering media, and wherein the second surface of the scattering media is larger than the first surface of the light-emitting structure.

Example 41 is a method comprising: providing a light-conversion device comprising a plurality of quantum dots placed in a nanoporous structure comprising one or more nanoporous materials; providing a light-emitting structure comprising one or more light-emitting devices; and attaching the light-conversion device to the light-emitting structure.

Example 42 includes the method of example 41, wherein attaching the light-conversion device to the light-emitting structure comprises bonding the nanoporous structure and a substrate of the light-emitting structure.

Example 43 includes the method of example 41, wherein providing the light-conversion device comprises: forming the nanoporous structure using a solid material; and placing the quantum dots in the nanoporous structure.

Example 44 includes the method of example 43, wherein the solid material comprises at least one of a semiconductor material, glass, plastic, metal, or polymer.

The terms "approximately," "about," and "substantially" may be used to mean within ±20% of a target dimension in some embodiments, within ±10% of a target dimension in some embodiments, within ±5% of a target dimension in some embodiments, and yet within ±2% in some embodiments. The terms "approximately" and "about" may include the target dimension.

In the foregoing description, numerous details are set forth. It will be apparent, however, that the disclosure may be practiced without these specific details. In some instances, well-known structures and devices are shown in block diagram form, rather than in detail, in order to avoid obscuring the disclosure.

The terms "first," "second," "third," "fourth," etc. as used herein are meant as labels to distinguish among different elements and may not necessarily have an ordinal meaning according to their numerical designation.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Reference throughout this specification to "an implementation" or "one implementation" means that a particular feature, structure, or characteristic described in connection with the implementation is included in at least one implementation. Thus, the appearances of the phrase "an implementation" or "one implementation" in various places throughout this specification are not necessarily all referring to the same implementation.

As used herein, when an element or layer is referred to as being "on" another element or layer, the element or layer may be directly on the other element or layer, or intervening elements or layers may be present. In contrast, when an element or layer is referred to as being "directly on" another element or layer, there are no intervening elements or layers present.

Whereas many alterations and modifications of the disclosure will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the disclosure.

What is claimed is:

1. A semiconductor device, comprising:
   a light-emitting structure comprising a first light-emitting device, a second light-emitting device, and a third light-emitting device; and
   a light-conversion device comprising a plurality of nanoporous structures separated by a plurality of trenches, wherein a first plurality of quantum dots is placed in a first nanoporous structure of the plurality of nanoporous structures, wherein a second plurality of quantum dots is placed in a second nanoporous structure of the plurality of nanoporous structures, wherein the first plurality of quantum dots converts light produced by the first light-emitting device into light of a first color, wherein the second plurality of quantum dots converts light produced by the second light-emitting device into light of a second color, and wherein the third light-emitting device emits light of a third color.

2. The semiconductor device of claim 1, wherein the first plurality of quantum dots is placed in a first plurality of pores in the first nanoporous structure, and wherein the second plurality of quantum dots is placed in a second plurality of pores in the second nanoporous structure.

3. The semiconductor device of claim 2, wherein a diameter of at least one of the first plurality of pores is not greater than 500 nm, and wherein a depth of the at least one of the first plurality of pores is not less than 1 μm.

4. The semiconductor device of claim 3, wherein the diameter of at least one of the first plurality of pores is not less than 1 nm.

5. The semiconductor device of claim 1, further comprising a protection structure covering surfaces of one or more of the first plurality of quantum dots and the second plurality of quantum dots, wherein the protection structure is positioned between the light-emitting structure and the plurality of nanoporous structures.

6. The semiconductor device of claim 1, wherein each of the first light-emitting device, the second light-emitting device, and the third light-emitting device is a micro-LED.

7. The semiconductor device of claim 1, wherein the first nanoporous structure and the second nanoporous structure are separated by a first trench, and wherein at least one sidewall of the first trench is coated with a metallic material.

8. The semiconductor device of claim 7, wherein the second nanoporous structure and a third nanoporous structure of the plurality of nanoporous structures are separated by a second trench.

9. The semiconductor device of claim 8, wherein no quantum dots are placed in the third nanoporous structure.

10. The semiconductor device of claim 1, further comprising scattering media configured to cause scattering of at least a portion of light produced by the light-emitting structure.

11. The semiconductor device of claim 1, wherein a sidewall of the semiconductor device is coated with a reflective material.

12. The semiconductor device of claim 1, wherein the plurality of nanoporous structures is not in direct contact with the light-emitting structure.

13. The semiconductor device of claim 1, wherein the first color is red, wherein the second color is green, and wherein the third color is blue.

14. The semiconductor device of claim 1, wherein a thickness of the light-conversion device is equal to or greater than 10 μm.

15. The semiconductor device of claim 1, wherein a dimension of the first light-emitting device is not greater than 50 μm.

16. The semiconductor device of claim 1, wherein each of the first light-emitting device, the second light-emitting device, and the third light-emitting device comprises a first ohmic contact and a second ohmic contact.

17. The semiconductor device of claim 16, wherein the light-conversion device is formed on a first side of the light-emitting structure, and wherein the first ohmic contact and the second ohmic contact are formed on a second side of the light-emitting structure.

18. The semiconductor device of claim 1, wherein the light-conversion device is attached to the light-emitting structure.

* * * * *